United States Patent
Lee

(10) Patent No.: US 9,710,328 B2
(45) Date of Patent: Jul. 18, 2017

(54) SEMICONDUCTOR MEMORY DEVICE AND OPERATING METHOD THEREOF

(71) Applicant: SK hynix Inc., Gyeonggi-do (KR)

(72) Inventor: Hyung-Min Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/705,671

(22) Filed: May 6, 2015

(65) Prior Publication Data

US 2016/0179617 A1    Jun. 23, 2016

(30) Foreign Application Priority Data

Dec. 17, 2014    (KR) .................. 10-2014-0182646

(51) Int. Cl.
| | | |
|---|---|---|
| *G11C 5/14* | (2006.01) | |
| *G06F 11/10* | (2006.01) | |
| *G11C 11/56* | (2006.01) | |
| *G11C 29/04* | (2006.01) | |

(52) U.S. Cl.
CPC ...... *G06F 11/1072* (2013.01); *G06F 11/1068* (2013.01); *G11C 11/5642* (2013.01); *G11C 2029/0411* (2013.01)

(58) Field of Classification Search
CPC ............. G06F 11/1048; G06F 11/1012; G06F 11/1068; G06F 12/00; G11C 16/26; G11C 29/52; G11C 5/147

See application file for complete search history.

(56) References Cited

U.S. PATENT DOCUMENTS

| | | | | |
|---|---|---|---|---|
| 8,305,811 | B2 * | 11/2012 | Jeon | ................. G11C 16/20 365/185.12 |
| 8,456,919 | B1 * | 6/2013 | Jeon | ................. G06F 11/1072 365/185.03 |
| 8,644,067 | B2 * | 2/2014 | Jeon | ................. G06F 11/1072 365/185.03 |
| 8,850,292 | B2 * | 9/2014 | Lee | ................. H03M 13/6306 365/185.09 |
| 9,000,390 | B2 * | 4/2015 | Citek | ................. G02C 7/028 250/372 |
| 9,142,323 | B1 * | 9/2015 | Lee | ................. G11C 16/3418 |
| 2009/0158124 | A1 * | 6/2009 | Kawai | ................. G06F 3/0614 714/763 |
| 2010/0162084 | A1 * | 6/2010 | Coulson | ................. G06F 11/1068 714/773 |
| 2011/0271032 | A1 * | 11/2011 | Yamada | ................. G06F 11/106 711/102 |

(Continued)

FOREIGN PATENT DOCUMENTS

| | | |
|---|---|---|
| KR | 1020100117906 | 11/2010 |
| KR | 1020110001101 | 1/2011 |

(Continued)

*Primary Examiner* — Phung M Chung

(74) *Attorney, Agent, or Firm* — IP & T Group LLP

(57) ABSTRACT

An operation method of a semiconductor memory system includes performing a first error correction code (ECC) decoding on a first data stored in the semiconductor memory system, wherein the first data includes user data, an ECC data for the user data and a status data for the user data; and performing a second ECC decoding on the user data by changing a read voltage based on the status data of the first data when the first ECC decoding on the user data fails.

17 Claims, 15 Drawing Sheets

(56) References Cited

U.S. PATENT DOCUMENTS

| | | | | |
|---|---|---|---|---|
| 2012/0008401 A1* | 1/2012 | Katz | ............... | G11C 16/26 |
| | | | | 365/185.18 |
| 2013/0051145 A1* | 2/2013 | Ahn | ............... | G11C 16/0483 |
| | | | | 365/185.11 |
| 2013/0073924 A1* | 3/2013 | D'Abreu | ............... | G06F 11/1048 |
| | | | | 714/763 |
| 2013/0135927 A1* | 5/2013 | Jeon | ............... | G06F 11/1072 |
| | | | | 365/185.03 |
| 2013/0139036 A1* | 5/2013 | Lee | ............... | G06F 11/1072 |
| | | | | 714/773 |
| 2014/0043903 A1* | 2/2014 | Ok | ............... | G11C 16/26 |
| | | | | 365/185.03 |
| 2014/0237319 A1* | 8/2014 | Seo | ............... | G06F 11/1048 |
| | | | | 714/764 |
| 2014/0240151 A1* | 8/2014 | Kawano | ............... | H03M 1/0607 |
| | | | | 341/118 |
| 2015/0149840 A1* | 5/2015 | Alhussien | ............... | H03M 13/1125 |
| | | | | 714/719 |

FOREIGN PATENT DOCUMENTS

| | | |
|---|---|---|
| KR | 1020120001405 | 1/2012 |
| KR | 1020130061967 | 6/2013 |

\* cited by examiner

FIG. 1A

|         | PGr1 | PGr2 | PGr3 | PGr4 | PGr5 |
|---------|------|------|------|------|------|
| Index 0 | PV10 | PV20 | PV30 | PV40 | PV50 |
| Index 1 | PV11 | PV21 | PV31 | PV41 | PV51 |
| Index 2 | PV12 | PV22 | PV32 | PV42 | PV52 |
| ⋮       | ⋮    | ⋮    | ⋮    | ⋮    | ⋮    |
| Index n | PV1n | PV2n | PV3n | PV4n | PV5n |

FIG. 1B

| | RGr1 | | |
|---|---|---|---|
| | REVL1 | REVL2 | REVL3 |
| Index 0 | RV10 | RV20 | RV30 |
| Index 1 | RV11 | RV21 | RV31 |
| Index 2 | RV12 | RV22 | RV32 |
| ⋮ | ⋮ | ⋮ | ⋮ |
| Index n | RV1n | RV2n | RV3n |

| | RGr2 | | |
|---|---|---|---|
| | REVL1 | REVL2 | REVL3 |
| Index 0 | RV10 | RV20 | RV30 |
| Index 1 | RV11 | RV21 | RV31 |
| Index 2 | RV12 | RV22 | RV32 |
| ⋮ | ⋮ | ⋮ | ⋮ |
| Index n | RV1n | RV2n | RV3n |

| | RGr3 | | |
|---|---|---|---|
| | REVL1 | REVL2 | REVL3 |
| Index 0 | RV10 | RV20 | RV30 |
| Index 1 | RV11 | RV21 | RV31 |
| Index 2 | RV12 | RV22 | RV32 |
| ⋮ | ⋮ | ⋮ | ⋮ |
| Index n | RV1n | RV2n | RV3n |

| | RGr4 | | |
|---|---|---|---|
| | REVL1 | REVL2 | REVL3 |
| Index 0 | RV10 | RV20 | RV30 |
| Index 1 | RV11 | RV21 | RV31 |
| Index 2 | RV12 | RV22 | RV32 |
| ⋮ | ⋮ | ⋮ | ⋮ |
| Index n | RV1n | RV2n | RV3n |

| | RGr5 | | |
|---|---|---|---|
| | REVL1 | REVL2 | REVL3 |
| Index 0 | RV10 | RV20 | RV30 |
| Index 1 | RV11 | RV21 | RV31 |
| Index 2 | RV12 | RV22 | RV32 |
| ⋮ | ⋮ | ⋮ | ⋮ |
| Index n | RV1n | RV2n | RV3n |

FIG. 6A
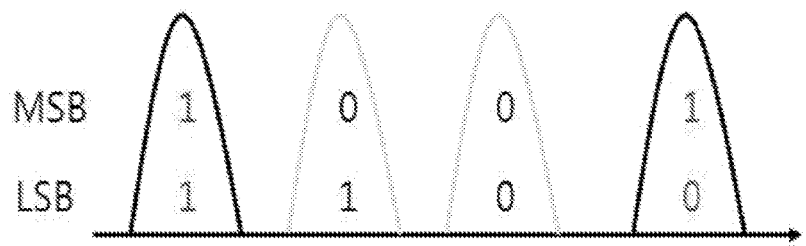
FIG. 6B
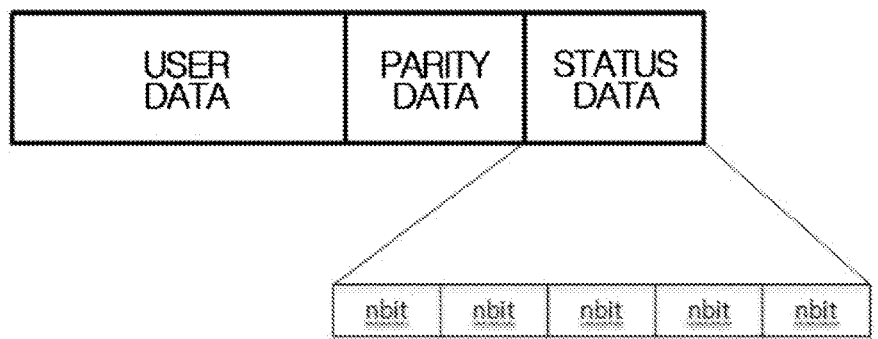
FIG. 6C
| Blk address | state |
|---|---|
| 0 | 1 |
| 1 | 2 |
| 2 | 1 |
| 3 | 1 |
| 4 | 2 |
| 5 | 1 |
| ... | ... |

SEMICONDUCTOR MEMORY DEVICE AND OPERATING METHOD THEREOF

CROSS-REFERENCE TO RELATED APPLICATIONS

The present application claims priority of Korean Patent Application No. 10-2014-0182646, filed on Dec. 17, 2014, which is herein incorporated by reference in its entirety.

BACKGROUND

1. Field

Various exemplary embodiments of the present invention relate to a semiconductor memory system, and more particularly, to a semiconductor memory system and an operating method thereof capable of improving reliability of data read.

2. Description of the Related Art

A nonvolatile semiconductor memory device such as a flash memory device retains data stored in a memory block despite of power cut-off. The nonvolatile semiconductor memory device can repeatedly store data into the memory block by repeatedly performing operations of programming and erasing data. The number of program/erase cycles represents the number of repetitions of such program operations and erase operations. A single program/erase cycle comprises a single program operation and a single erase operation. As the program operations and the erase operations are repeatedly performed, the number of program/erase cycles may increase.

The numbers of program/erase cycles may be divided into a plurality of program/erase cycle groups with reference to a program voltage. Also, the number of program/erase cycles may be divided into a plurality of read-retry groups with reference to a read voltage.

FIG. 1A is a table illustrating the program/erase cycle groups applicable to data program in a semiconductor memory device. FIG. 1B is a table illustrating the read-retry groups applicable to data read in a semiconductor memory device.

Referring to FIG. 1A, the program/erase cycle groups may comprise first to fifth program/erase cycle groups PGr1, PGr2, PGr3, PGr4 and PGr5. For example, the first program/erase cycle group PGr1 may represent the number of program/erase cycles ranging over 0 and under 0.2K, the second program/erase cycle group PGr2 may represent the number of program/erase cycles ranging over 0.2K and under 0.5K the third program/erase cycle group PGr3 may represent the number of program/erase cycles ranging over 0.5K and under 1K, the fourth program/erase cycle group PGr4 may represent the number of program/erase cycles ranging over 1K and under 2K, and the fifth program/erase cycle group PGr5 may represent the number of program/erase cycles ranging over 2K and under 3K.

Each of the first to fifth program/erase cycle groups PGr1, PGr2, PGr3, PGr4 and PGr5 includes a plurality of indexes representing addresses of the memory block. The plurality of indexes may correspond to the plurality of program voltages PVL, respectively. For example, Index 0 to Index n of the first program/erase cycle group PGr1 may correspond to values of the program voltages PV10 to PV1$n$ applied to the $0^{th}$ to $n^{th}$ memory blocks, respectively, during the data programming. Index 0 to Index n of the second program/erase cycle group PGr2 may correspond to values of the program voltages PV20 to PV2$n$ applied during the data programming. Index 0 to Index n of the third program/erase cycle group PGr3 may correspond to values of the program voltages PV30 to PV3$n$ applied during the data programming. Index 0 to Index n of the fourth program/erase cycle group PGr4 may correspond to values of the program voltages PV40 to PV4$n$ applied during the data programming. Index 0 to Index n of the fifth program/erase cycle group PGr5 may correspond to values of the program voltages PV50 to PV5$n$ applied during the data programming.

Referring to FIG. 1B, the read-retry groups may comprise first to fifth read-retry groups RGr1, RGr2, RGr3, RGr4 and RGr5. The first to fifth read-retry groups RGr1, RGr2, RGr3, RGr4 and RGr5 corresponds to first to fifth program/erase cycle groups PGr1, PGr2, PGr3, PGr4 and PGr5, respectively.

For example, the first read-retry group RGr1 may represent the number of program/erase cycles ranging over 0 and under 0.2K, the second read-retry group RGr2 may represent the number of program/erase cycles ranging over 0.2K and under MK, the third read-retry group RGr3 may represent the number of program/erase cycles ranging over 0.5K and under 1K, the fourth read-retry group RGr4 may represent the number of program/erase cycles ranging over 1K and under 2K, and the fifth read-retry group RGr5 may represent the number of program/erase cycles ranging over 2K and under 3K.

Each of the first to fifth read-retry groups RGr1, RGr2, RGr3, RGr4 and RGr5 includes Index 0 to Index n, respectively. Each of Index 0 to Index n may correspond to values of plural read voltages applied to the $0^{th}$ to $n^{th}$ memory blocks, respectively, during data read of multi-level cell (MLC) flash memory device. For example, the 0th index (Index 0) may correspond to 3 values RV10, RV20 and RV30 of the read voltages REVL1, REVL2, and REVL3 applied to the $0^{th}$ memory block during the data read of MLC. The first index (Index 1) may correspond to 3 values RV11, RV21 and RV31 of the read voltages REVL1, REVL2, and REVL3 applied to the first memory block during the data read of MLC. The $n^{th}$ index (Index n) may correspond to 3 values RV1$n$, RV2$n$ and RV3$n$ of the read voltages REVL1, REVL2, and REVL3 applied to the $n^{th}$ memory block during the data read of MLC.

The plural program/erase cycle groups and the plural read-retry groups may be managed by unit of a memory chip.

When data is programmed into a semiconductor memory device using the first to fifth program/erase cycle groups PGr1, PGr2, PGr3, PGr4 and PGr5, and then the data is read from the semiconductor memory device using the first to fifth read-retry groups RGr1, RGr2, RGr3, RGr4 and RGr5, a mismatch may occur.

For example, the data program operation is performed to the first memory block in a memory chip using the second program/erase cycle group PGr2 when the number of program/erase cycles of the memory chip is 499. After that, the data program operation is performed to the third memory block of the same memory chip using the third program/erase cycle group PGr3 when the number of program/erase cycles of the memory chip is changed to 501 due to further program operation to the same memory chip. That is, the data program operation is performed to the first and third memory blocks of the same memory chip using the second and the third program/erase cycle groups PGr2 and PGr3 which are different from each other, according to the number of program/erase cycles.

After that, during the data read operation to the first memory block, data is read from the first memory block with reference to the third read-retry group RGr3 when the number of program/erase cycles of the memory chip is under 999.

Read fail of the first memory block may occur because data is programmed to the first memory block using the second program/erase cycle group PGr2 and the programmed data is read from the first memory block with reference to the third read-retry group RGr3, That is, the read fail of the first memory block may occur because of the difference between the program condition and the read condition.

As described above, the read fail may occur when the program condition and the read condition are different from each other. Therefore, stable operation of the semiconductor memory device may not be performed, deteriorating the characteristic of the semiconductor memory device.

SUMMARY

Various embodiments of the present invention are directed to a semiconductor memory system and an operating method thereof capable of reliably reading data.

In accordance with an embodiment of the present invention, an operation method of a semiconductor memory system may include: performing a first error correction code (ECC) decoding on a first data stored in the semiconductor memory system, wherein the first data includes user data, an ECC data for the user data and a status data for the user data; and performing a second ECC decoding on the user data by changing a read voltage based on the status data of the first data when the first ECC decoding on the user data fails.

The status data may include information of a program voltage used when the first data is stored into the semiconductor memory system.

The information of the program voltage may be an index corresponding to one among a plurality of program voltage groups, each of which is a group of program voltages to be used for storing a data into the semiconductor memory system, and each of which is indexed.

The second step may perform the second ECC decoding on the user data through a way of read-retry according to one or more read-retry voltages corresponding to the index.

The semiconductor memory system may be a multi-level cell (MLC) memory system. The status data may be a least significant bit (LSB) data. A most significant bit (MSB) data corresponding to the status data may have a value of "FF". The status data may include a plurality of information of a program voltage used when the first data is stored into the semiconductor memory system.

The semiconductor memory system may include a status data storage region. An index of a data unit for a program operation and the status data of the data unit may be stored in the status data storage region.

In accordance with an embodiment of the present invention, a semiconductor memory system may include: a semiconductor memory device; and a controller, wherein the controller comprises: a first device performing a first ECC decoding on a user data of a first data stored in the semiconductor memory system, wherein the first data includes the user data, an ECC data for the user data, and a status data for the user data; and a second device performing a second ECC decoding on the user data by changing a read voltage based on the status data of the first data when the first ECC decoding on the user data fails.

The status data may include information of a program voltage used when the first data is stored into the semiconductor memory system. The information of the program voltage may be an index corresponding to one among a plurality of program voltage groups, each of which is a group of program voltages to be used for storing a data into the semiconductor memory system, and each of which is indexed.

The second device may perform the second ECC decoding on the user data through a way of read-retry according to one or more read-retry voltages corresponding to the index. The semiconductor memory system may be a multi-level cell (MLC) memory system. The status data may be an least significant bit (LSB) data. A most significant bit (MSB) data corresponding to the status data may have a value of "FF".

The status data may include a plurality of information of a program voltage used when the first data is stored into the semiconductor memory system. The semiconductor memory system may include a status data storage region. An index of a data unit for a program operation and the status data of the data unit may be stored in the status data storage region.

In accordance with an embodiment of the present invention, a controller may include: a first device performing a first ECC decoding with a first read voltage on a user data of a first data stored in a semiconductor memory system, and for determining whether or not the first decoding on the user data succeeds, wherein the first data includes the user data, an ECC data for the user data, and a status data for the user data; a second device changing the first read voltage to a second read voltage based on the status data of the first data when the first ECC decoding on the user data fails; and a third device performing a second ECC decoding with the second read voltage on the user data, and for determining whether or not the second decoding on the user data succeeds, wherein the third means repeats the performing of the second ECC decoding on the user data by changing the second read voltage a predetermined number of times until the second ECC decoding on the user data succeeds.

The status data may include information of a program voltage used when the first data is stored into the semiconductor memory system. The information of the program voltage may be an index corresponding to one among a plurality of program voltage groups, each of which is a group of program voltages to be used for storing a data into the semiconductor memory system, and each of which is indexed.

The third device may perform the second ECC decoding on the user data through a way of read-retry according to one or more read-retry voltages corresponding to the index. The status data may include a plurality of repeated information of a program voltage used when the first data is stored into the semiconductor memory system.

In accordance with an embodiment of the present invention, information of a program/erase cycle group including information of a program voltage used during a data program operation to a memory block is additionally stored. When ECC decoding to the programmed data fails, the programmed data may be re-read on the basis of the information of the program/erase cycle group. Therefore, the programmed data may be reliably read.

In accordance with an embodiment of the present invention, information of a program/erase cycle group including information of a program voltage, which is used while user data is programmed into a memory block, is additionally stored as status data. When a first ECC decoding to the programmed user data fails, a read operation may be performed again to the programmed user data and a second ECC decoding may be performed to the re-read user data based on the programmed status data. Therefore, the user data may be reliably read.

BRIEF DESCRIPTION OF THE DRAWINGS

FIG. 1A is a table illustrating program/erase cycle groups applicable to program data in a semiconductor memory device.

FIG. 1B is a table illustrating read-retry groups applicable to read data from a semiconductor memory device.

FIGS. 6A to 6C are diagrams schematically illustrating an operation of storing status data into a memory block in accordance with an embodiment of the present invention.

DETAILED DESCRIPTION

Figure 2:
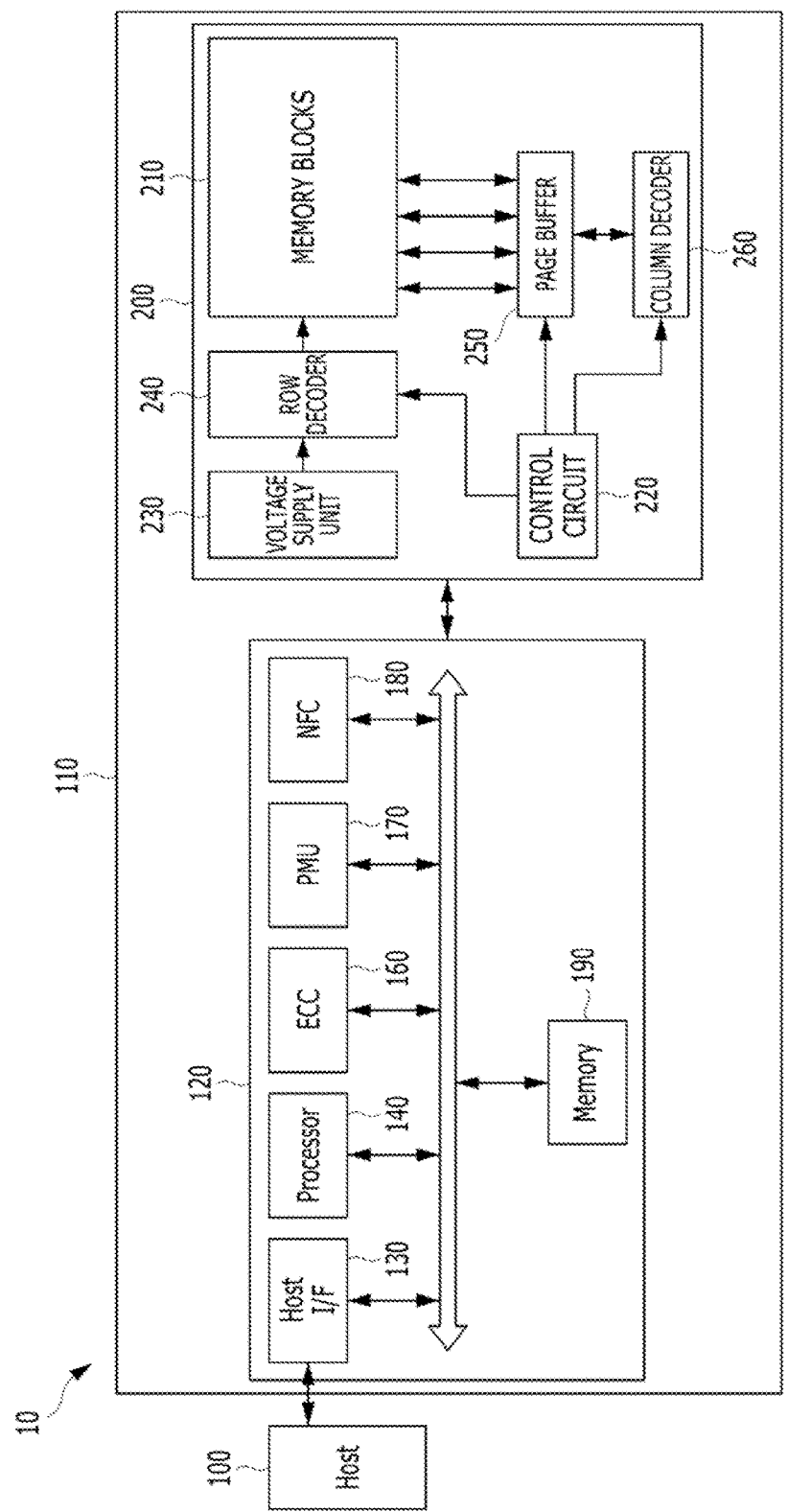
FIG. 2 is a block diagram schematically illustrating a semiconductor memory system in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough, complete and will fully convey the scope of the present invention to those skilled in the art. The drawings are not necessarily to scale and in some instances, proportions may have been exaggerated to clearly illustrate features of the embodiments. Throughout the disclosure, reference numerals correspond directly to the like parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. When a first layer is referred to as being "on" a second layer or "on" a substrate, it not only refers to a case where the first layer is formed directly on the second layer or the substrate but also a case where a third layer exists between the first layer and the second layer or the substrate.

FIG. 2 is a block diagram schematically illustrating a semiconductor memory system 110 in accordance with an embodiment of the present invention. FIG. 2 exemplarily shows a data processing system 10 including the semiconductor memory system 110 in accordance with an embodiment of the present invention.

Referring to FIG. 2, the data processing system 10 include a host HOST 100 and the semiconductor memory system 110. The host 100 may be one of portable electronic devices including a cellular phone, a MP3 player, a laptop computer, and so forth, and electronic devices such as a desktop computer, a game player, a TV, a projector, and so forth.

The semiconductor memory system 110 may operate in response to a request from the host 100, and may store data to be accessed by the host 100. That is, the semiconductor memory system 110 may serve as a main storage device or a secondary storage device of the host 100. The semiconductor memory system 110 may be implemented as one of various storage devices according to a host interface protocol coupled to the host 100. For example, the semiconductor memory system 110 includes solid state drive (SSD), a multimedia card (MMC), an embedded MMC (eMMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), a universal storage bus (USB) storage device, a universal flash storage (UFS) device, a compact flash (CF) card, a smart media (SM) card, a memory stick, and so forth.

The storage devices may be implemented with one or more of volatile memory devices such as a DRAM (Dynamic Random Access Memory) and a SRAM (Static RAM) and nonvolatile memory devices such as a ROM (Read Only Memory), a MROM (Mask ROM), PROM (Programmable ROM), an EPROM (Erasable ROM), an EEPROM (Electrically Erasable ROM), a FRAM (Ferromagnetic ROM), a PRAM (Phase change RAM), a MRAM (Magnetic RAM), a RRAM (Resistive RAM) and a flash memory.

The semiconductor memory system 110 may include a semiconductor memory device 200 and a memory controller 120. The semiconductor memory device 200 may store data to be accessed by the host 100. The memory controller 120 may control storing data into the semiconductor memory device 200.

The controller 120 and the semiconductor memory device 200 may be integrated as a single semiconductor device. For example, the controller 120 and the semiconductor memory device 200 may be integrated as a single semiconductor device to form the SSD. When the semiconductor memory system 110 is used as the SSD, operation speed of the host 100 coupled to the semiconductor memory system 110 may be remarkably improved.

The controller 120 and the semiconductor memory device 200 may be integrated as a single semiconductor device to configure a memory card. For example, the controller 120 and the semiconductor memory device 200 may be integrated as a single semiconductor device to form a memory card such as a PC card of personal computer memory card international association (PCMCIA), a compact flash (CF) card, a smart media (SM) card, a memory stick, a multimedia card (MMC), a reduced-size multimedia card (RS-MMC), and a micro-size version of MMC (MMCmicro), a secure digital (SD) card, a mini secure digital (miniSD) card, a micro secure digital (microSD) card, a secure digital high capacity (SDHC), a universal flash storage (UFS), and so forth.

For another example, the semiconductor memory system 110 may be provided as one of various elements forming an electronic device such as a computer, an ultra-mobile PC (UMPC), a workstation, a net-book computer, a personal digital assistants (PDA), a portable computer, a web tablet PC, a tablet computer, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, an radio-frequency identification (RFID) device, or elements and devices of a computing system.

The semiconductor memory device 200 of the semiconductor memory system 110 may retain data stored therein even when a power supply is cut off. The semiconductor memory device 200 may store data provided from the host 100 through a write operation, and may provide the stored data to the host 100 through a read operation.

The semiconductor memory device 200 may include a memory block 210, a control circuit 220, a voltage management unit 230, a row decoder 240, a page buffer 250, and a column decoder 260. The semiconductor memory device 200 may be a nonvolatile memory device, for example a flash memory device. The semiconductor memory device 200 may be of a 3-dimensional (3D) stacked structure.

The memory block 210 may include a plurality of pages, each of which includes a plurality of memory cells coupled to a plurality of word lines WL. The control circuit 220 may control overall operations of the semiconductor memory device 200 including program, erase and read operations.

The voltage management unit 230 may provide word line voltages, for example program, read, and pass voltages, to each of the plurality of word lines according to operation modes and may provide a voltage to a bulk, for example a well region, where the plurality of memory cells are formed. The voltage management unit 230 may provide the voltages under the control of the control circuit 220. The voltage management unit 230 may provide a plurality of variable read voltages to generate a plurality of read data.

The row decoder 240 may select one of a plurality of memory blocks or sectors of the memory cell array 210, and may select one of the plurality of word lines of the selected memory block under the control of the control circuit 220. The row decoder 240 may provide the word line voltages, which is generated by the voltage management unit 230, to the selected word line and the non-selected word lines, respectively, under the control of the control circuit 220.

The page buffer 250 may operate under the control of the control circuit 220. During the program operation, the page buffer 250 may serve as a write driver for driving bit lines according to data to be stored in a memory cell array 211. During the program operation, the plurality of page buffers 250 may receive data to be programmed into the memory cell array 211 from a buffer (not illustrated), and may drive the bit lines according to the received data. The plurality of page buffers 250 may correspond to a plurality of columns or bit lines, or to a plurality of column pairs or bit line pairs, respectively. The page buffer 250 may include a plurality of latches.

The memory controller 120 of the semiconductor memory system 110 may control the semiconductor memory device 200 in response to the request from the host 100. For example, the memory controller 120 may provide to the host 100 data read from the semiconductor memory device 200, and may store into the semiconductor memory device 200 data provided from the host 100. To this end, the memory controller 120 may control the program, read, and erase operations of the semiconductor memory device 200.

The memory controller 120 may include a host interface unit (HOST I/F) 130, a processor 140, an ECC unit 150, a power management unit (PMU) 170, a NAND flash controller (NEC) 180, and a memory 190.

The host interface unit 130 may process a command and data provided from the host 100. The host interface unit 130 may communicate with the host 100 through one or more interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (DATA), an enhanced small disk interface (ESDI), and an integrated drive electronics (IDE).

The ECC unit 160 may detect and correct errors included in data read from the semiconductor memory device 200 during the read operation. The ECC unit 160 may perform an ECC decoding operation to data read from the semiconductor memory device 200, determine whether or not the ECC decoding succeeds, provide an instruction signal according to the determination, and correct an error bit included in the read data using parity bits generated through ECC encoding. When the ECC unit 160 may not correct error bits or the number of correction operations made exceeds a given error correction capacity, an ECC fail signal generates according to failure of the ECC decoding.

The ECC unit 160 may correct an error through a coded modulation such as a low density parity check (LDPC) code, a Bose-Chaudhuri-Hocquenghem (BCH) code, a turbo code, an Reed-Solomon (RS) code, a convolution code, an RSC (Recursive Systematic Code), Trellis-Coded Modulation (TCM), Block Coded Modulation (BCM), and so on. The ECC unit 160 may include an error correction circuit, an error correction system, and an error correction device.

The PMU 170 may manage power of the memory controller 120 or power of elements included in the memory controller 120.

The NFC 180 may serve as an interface between the memory controller 120 and the semiconductor memory device 200 for the memory controller 120 to control the semiconductor memory device 200 in response to the request from the host 100, and may generate a control signal of the semiconductor memory device 200 and process data under the control of the processor 140 when the semiconductor memory device 200 is a flash memory device, for example a NAND flash memory device.

The memory 190 may serve as an operation memory of the semiconductor memory system 110 and the memory controller 120, and may store data used for driving the semiconductor memory system 110 and the memory controller 120. The memory controller 120 controls the semiconductor memory device 200 in response to the request from the host 100, for example, the memory controller 120 provides to the host 100 data read from the semiconductor memory device 200 and stores into the semiconductor memory device 200 data provided from the host 100. To this end, the memory controller 120 controls the program, read, and erase operations of the semiconductor memory device 200 and the memory 190 may store data required for such operations between the memory controller 120 and the semiconductor memory device 200.

The memory 190 may be implemented with the volatile memory, for example, the SRAM or the DRAM. The memory 190 may store data required for the operations between the memory controller 120 and the semiconductor memory device 200, data required for the program and read operations, and data to be programmed and read during the program and read operations. To this end, the memory 190 may include a program memory, a data memory, a write buffer, a read buffer, a map buffer, and so forth.

The memory 190 may store data required for operations including data read between the ECC unit 160 and the processor 140 and data to be stored during the data read operation. That is, the memory 190 may store data which is read from the semiconductor memory device 200. The data may include user data, ECC data and status data. The status data may include the information of the program/erase cycle group, which is applied while the data is programmed into the memory block 210 of the semiconductor memory device 200.

The processor 140 may perform general control operation of the semiconductor memory system 110 and may control the program and read operations of the semiconductor memory device 200 in response to program and read requests from the host 100. The processor 140 may drive firmware referred to as the flash translation layer (FTL) to perform the general control operation of the semiconductor memory system 110. The processor 140 may be implemented as a microprocessor or a central processing unit (CPU).

The processor 140 may have the semiconductor memory device 200 and program data with reference to the program/erase cycle groups corresponding to the number of program/erase cycles of the memory chip during the data program operation to the memory block 210 of the memory chip.

More specifically, the data to be programmed to the memory block 210 may be the user data, the ECC data, and the status data. The ECC data may be used for the error detection and the error correction of the user data.

Hereinafter, the first and the second error correction code (ECC) decoding operations are describe in more detail. As mentioned above, the status data may include an index of the program/erase cycle group including a program voltage, which is applied while the user data is programmed into the memory block 210 of the semiconductor memory device 200. That is, the status data may include the information of the program voltage used for programming of the user data. The status data may represent the program voltage corresponding to a read voltage to be used for reading of the user data programmed in the memory block 210 in order to prevent the mismatch between the program voltage and the read voltage.

The status data may include the index of the program/erase cycle group, the size of which is below 2 Byte, may be stored with the user data and the ECC data.

When the processor 140 receives a signal representing ECC decoding failure on the user data from the ECC unit 160, the processor 140 may check the program/erase cycle group represented by the status data corresponding to the user data, on which the ECC decoding fails, based on the information of the program/erase cycle groups stored in the memory 190 as described with reference to FIG. 1A, may control the semiconductor memory device 200 to re-read the user data using the read voltage included in the read-retry group corresponding to the program/erase cycle group represented by the status data corresponding to the user data, on which the ECC decoding fails, and provide the re-read user data to the ECC unit 160.

Figure 3:
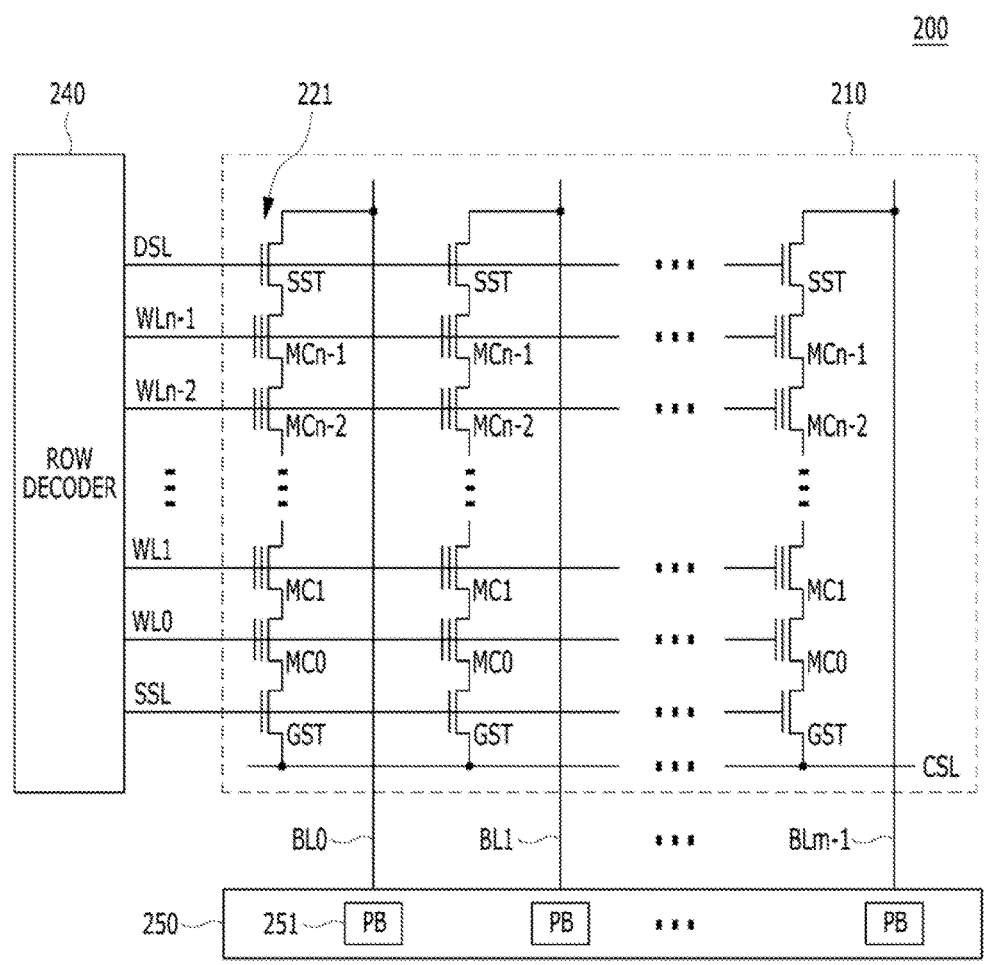
FIG. 3 is a circuit diagram schematically illustrating a memory cell array circuit of a memory block included in a semiconductor memory device in accordance with an embodiment of the present invention.

FIG. 3 is a circuit diagram schematically illustrating a memory cell array circuit of the memory block 210 included in the semiconductor memory device 200 in accordance with an embodiment of the present invention.

Referring to FIG. 3, the memory block 210 may include a plurality of cell strings 221 coupled to bit lines BL0 to BLm−1, respectively. The cell string 221 of each column may include one or more drain selection transistors DST and one or more source selection transistors SST. A plurality of memory cells or memory cell transistors may be serially coupled between the selection transistors DST and SST.

Each of the memory cells MC0 to MCn−1 may be formed of a multi-level cell (MLC) storing data information of multiple bits in each cell. The strings 221 may be electrically coupled to the corresponding bit lines BL0 to BLm−1, respectively.

Figure 4:
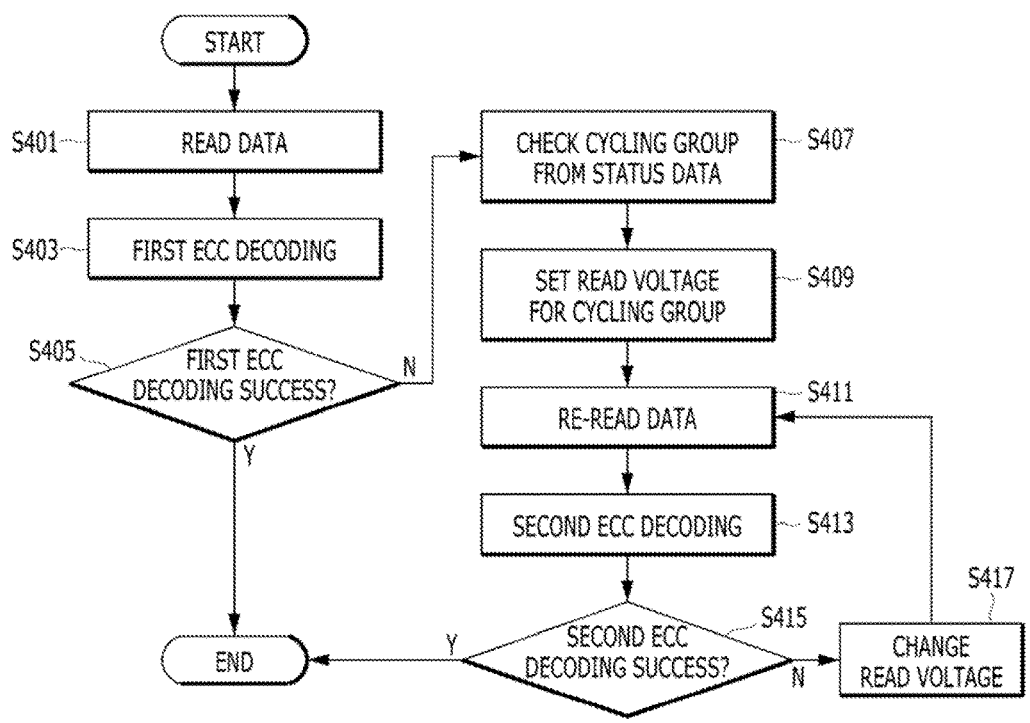
FIG. 4 is a flow chart illustrating an operation of a semiconductor memory device in accordance with an embodiment of the present invention.
Figure 5:
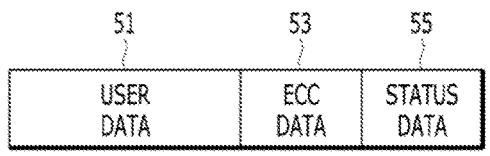
FIG. 5 is a schematic diagram illustrating a data format in accordance with an embodiment of the present invention.

FIG. 4 is a flow chart illustrating operation of a semiconductor memory device in accordance with an embodiment of the present invention. FIG. 5 is a schematic diagram illustrating a data format in accordance with an embodiment of the present invention.

Referring to FIG. 4, at step S401, the controller 120 may receive data, which is read from the memory block 210 of the semiconductor memory device 200. The data may be read through a read voltage which is one of the read-retry groups corresponding to the current number of program/erase cycles of the memory block 210 of the memory chip. For example, the controller 120 may check the current number of program/erase cycles of the memory chip including the memory block 210 while the read operation is performed to the data. In an embodiment, the data is programmed to the memory block 210 through a program voltage belonging to the first program/erase cycle group PGr1. When the checked number of program/erase cycles of the memory chip falls in a range over 0.2K and under 0.5K, the controller 120 may control the semiconductor memory device 200 to read the data using the read voltages REVL1, REVL2 and REVL3 of the second read-retry group RGr2 corresponding to the checked number of program/erase cycles of the memory chip failing in the range over 0.2K and under 0.5K. The read data will be described with reference to FIG. 5.

Referring to FIG. 5, the data programmed into the memory block 210 may include the user data 51, the ECC data 53, and the status data 55. The ECC data 53 may be used for the error detection and the error correction of the user data 51. The status data 55 may include the index of the program/erase cycle group including the program voltage, which is applied while the user data 51 is programmed into the memory block 210 of the semiconductor memory device 200. That is, the status data 55 may include the information of the program voltage used for programming of the user data 51. The status data 55 may represent the program voltage corresponding to the read voltage to be used for reading of the user data 51 programmed in the memory block 210 to prevent the mismatch between the program voltage and the read voltage.

The status data 55 may include the index of the program/ erase cycle group. The size of the index is below 2 Bytes. The status data 55 may be stored along with the user data 51 and the ECC data 53.

The ECC decoding to the data including the status data 55 may fail and thus the read status data 55 may have an error. Accordingly, the controller 120 may not check the read-retry group corresponding to the program/erase cycle group through the information of the program/erase cycle groups and the read-retry groups stored in the memory 190 as described with reference to FIGS. 1A and 1B due to the read status data 55 having the error. The operation of storing the status data 55 to prevent the error of the status data 55 during read operation to the status data 55 will be described with reference to FIGS. 6A to 6C.

FIGS. 6A to 6C are diagrams schematically illustrating an operation of storing the status data into the memory block in accordance with an embodiment of the present invention. Referring to FIG. 6A, the status data 55 including the index of the program/erase cycle group may be programmed during programming of the LSB data into the memory cell.

As illustrated in FIG. 6A, 2-bit multi-level cell (MLC) may have 4 states of 2-bit programmed data. The status data 55 including the index of the program/erase cycle group may be programmed as a LSB data and a value of "FF" may be programmed as a dummy MSB data corresponding to the status data 55. The MLC storing the dummy MSB and the status data 55 as the LSB data may have one of the erase state E and the third program state P3 among the 4 states of the erase state E and the first to third program states P1 to P3, and therefore the noise margin may be secured.

Referring to FIG. 6B, the status data 55 included in the data to be programmed into the memory block 210 may repeatedly include the index of the program/erase cycle group. For example, when the status data 55 has the size of 2 Bytes or less, 6 copies of the index of the program/erase cycle group having the size of 3 bits may be included in the status data 55. Later on, the status data 55 including the repeated copies of the index of the program/erase cycle group may be read, and a major representation, that is, the index which is most frequently found in the status data, among the plural read representations for the index of the program/erase cycle group included in the status data 55 may be determined as the index of the program/erase cycle group.

The status data 55 may be erroneously read. However, when the status data 55 includes the repeated copies of the index of the program/erase cycle group, the major representation among the plural representations for the index of the program/erase cycle group included in the status data 55 during read operation to the status data 55 may determine the index of the program/erase cycle group. That is it is highly probable that the major representation repeatedly found in the status data 55, among the plural representations for the index of the program/erase cycle group during read operation to the status data 55 is the index of the program/erase cycle group.

Referring to FIG. 6C, the index of the program/erase cycle group may be stored in a separate status data storage region, which is different from the embodiments described with reference to FIGS. 6A and 6B. For example, when a data is programmed into the first memory block using the program voltage belonging to the first program/erase cycle group PGr1, the address of the first memory block and the index of the first program/erase cycle group PGr1, may be stored into the separate status data storage region. In such a manner, the status data 55 stored in the separate status data storage region may be secured without an error. Therefore, even when the data programmed into the first memory block has an error, the controller 120 may identify the index of the program/erase cycle group of the status data 55 stored in the separate status data storage region to identify the read-retry group corresponding to the program/erase cycle group represented by the status data 55 for reliably re-reading the programmed data using the read-retry group corresponding to the program/erase cycle group represented by the status data 55.

Referring back to FIG. 4, at step S403, the controller 120 may perform a first ECC decoding to the data, which is read from the memory block 210 at step S401, for error detection and error correction. The controller 120 may perform the first ECC decoding to the user data 51 included in the data, which is read from the memory block 210 at step S401, using the ECC data 53 also included in the data, which is read from the memory block 210 at step S401. At step S405, the controller 120 may determine whether or not the first ECC decoding succeeds.

When the first ECC decoding is determined successful at step S405, the controller 120 may provide the data, to which the first ECC decoding is performed, to the host 100.

When the first ECC decoding is determined unsuccessful at step S405, the controller 120 at step S407 may check the index of the program/erase cycle group from the status data 55 of the data, which is read from the memory block 210 at step S401.

At step S409, the controller 120 may identify the read-retry group corresponding to the program/erase cycle group represented by the index included in the status data 55 and may set the read voltage for reliably re-reading the programmed data from the memory block 210 using the read-retry group corresponding to the program/erase cycle group represented by the status data 55.

At step S411, the controller 120 may have the semiconductor memory device 200 read again the same data using the read voltage identified at step S409. For example, when the data is programmed through the program voltage belonging to the first program/erase cycle group PGr1, the controller 120 at step S409 may identify the first read-retry group RGr1 corresponding to the first program/erase cycle group PGr1 represented by the $0^{th}$ index (Index 0) included in the status data 55 of the data, which is read from the memory block 210 at step S401, and may set the read voltage REVL1, REVL2, and REVL3 for re-reading the same data from the memory block 210. At step S411, the controller 120 may have the semiconductor memory device 200 read again the same data from the memory block using the read voltage REVL1, REVL2, and REVL3 of the first read-retry group RGr1, which is identified at step S409.

At step S413, the controller 120 may perform a second ECC decoding to the data, which is read from the memory block 210 at step S411, for error detection and error correction. The controller 120 may perform the second ECC decoding to the user data 51 included in the data, which is read from the memory block 210 at step S411, using the ECC data 53 also included in the data, which is read from the memory block 210 at step S411. At step S415, the controller 120 may determine whether or not the second ECC decoding succeeds.

When the second ECC decoding is determined successful at step S415, the controller 120 may provide the data, to which the second ECC decoding is performed, to the host 100.

When the second ECC decoding is determined to fail at step S415, the controller 120 may change the read voltage of the current index of the read-retry group to the read voltage of the next index of the read-retry group at step S417. For example, when the second ECC decoding with the read voltage REVL1, REVL2, and REVL3 of the $0^{th}$ index (Index 0) of the first read-retry group RGr1 is determined to fail at step S415, the controller 120 at step S417 may change the read voltage from REVL1, REVL2, and REVL3 of the $0^{th}$ index (Index 0) of the first read-retry group RGr1 to the read voltage REVL1, REVL2 and REVL3 of the first index (Index 1) of the first read-retry group RGr1.

Steps S411 to S417 may be repeated until the second ECC decoding to the data, which is read from the memory block 210 at step S411, succeeds. During the repetition, the read voltage REVL1, REVL2, and REVL3 may be changed through the index of the read retry group.

In accordance with an embodiment of the present invention, information of a program/erase cycle group including information of a program voltage, which is used while user data is programmed into a memory block, is additionally stored as the status data 55. When a first ECC decoding to the programmed user data fails, a read operation may be performed again to the programmed user data and a second ECC decoding may be performed to the re-read user data based on the programmed status data. Therefore, the user data may be reliably read.

When the semiconductor memory device 200 of the semiconductor memory system 110 in accordance with an embodiment of the present invention is implemented as a three-dimensional (3D) nonvolatile memory device, the semiconductor memory device 200 will be described in more detail.

FIGS. 7 to 14 are diagrams schematically illustrating a three-dimensional (3D) nonvolatile memory device of a semiconductor memory device, for example, a flash memory device implemented in 3D, in accordance with an embodiment of the present invention.

Figure 7:
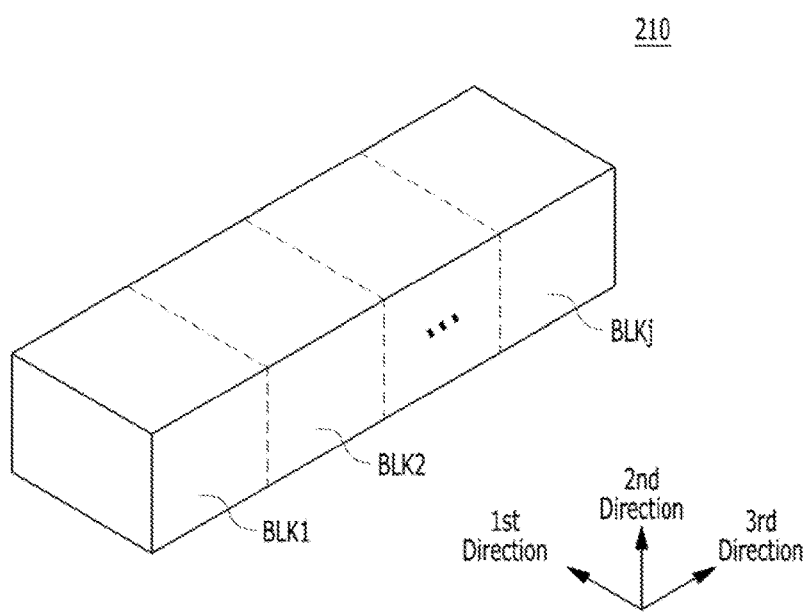
FIGS. 7 to 11 are diagrams schematically illustrating a three-dimensional (3D) nonvolatile memory device in accordance with an embodiment of the present invention.

FIG. 7 is a block diagram of a memory cell array of the memory block 210 shown in FIG. 2. Referring to FIG. 7, the memory cell array may include a plurality of memory blocks BLK1 to BLKj, where j is an integer. Each of the plural memory blocks BLK1 to BLKj may have a 3D structure or a vertical structure. For example, each of the plural memory blocks BLK1 to BLKj may include structures extending along first to third directions, for example, X, Y and Z-directions.

Each of the plural memory blocks BLK1 to BLKj may include a plurality of NAND strings NS extending along the second direction. A plurality of NAND strings NS may be provided along the first and third directions. Each of NAND strings NS may be coupled to a bit line BL, one or more string select lines SSL, one or more ground select lines GSL, a plurality of word lines WL, one or more dummy word line DWL, and a common source line CSL. That is, each of the plural memory blocks BLK1 to BLKj may be coupled to a plurality of bit lines BL, a plurality of string select lines SSL, a plurality of ground select lines GSL, a plurality of word lines WL, a plurality of dummy word lines DWL, and a plurality of common source lines CSL.

Figure 8:
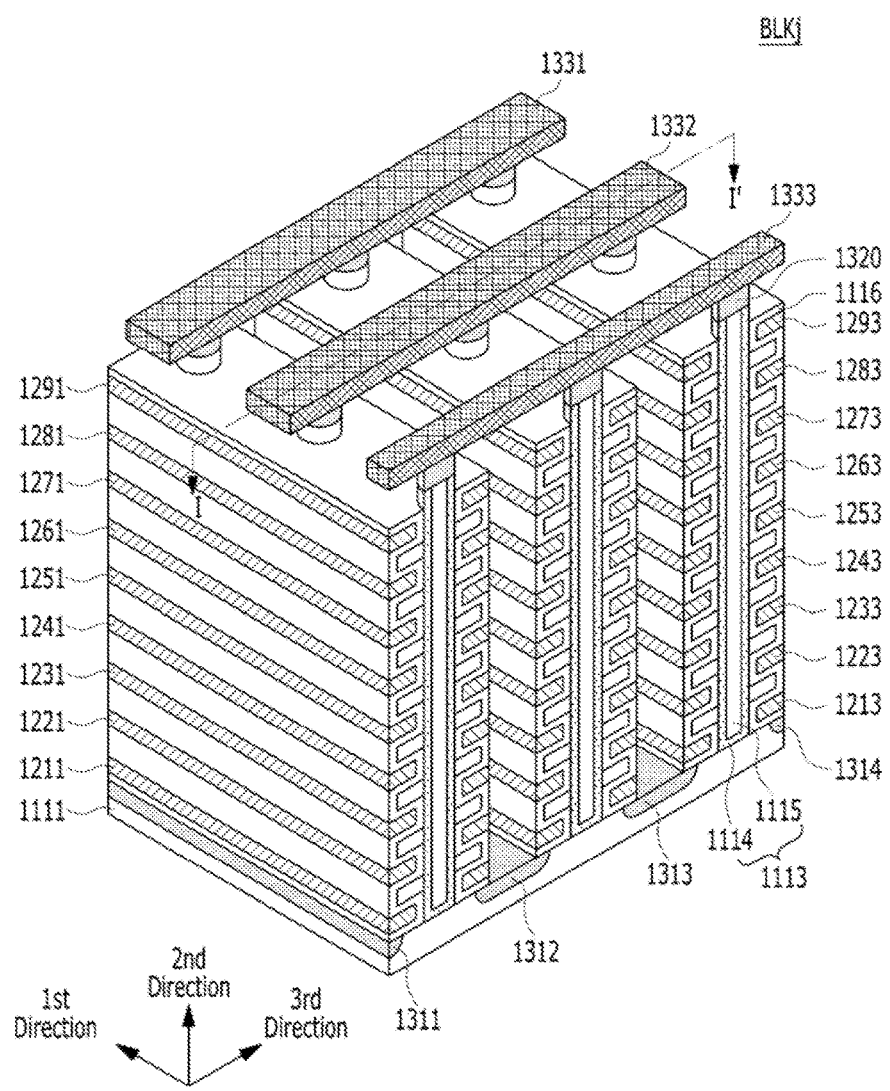
Figure 9:
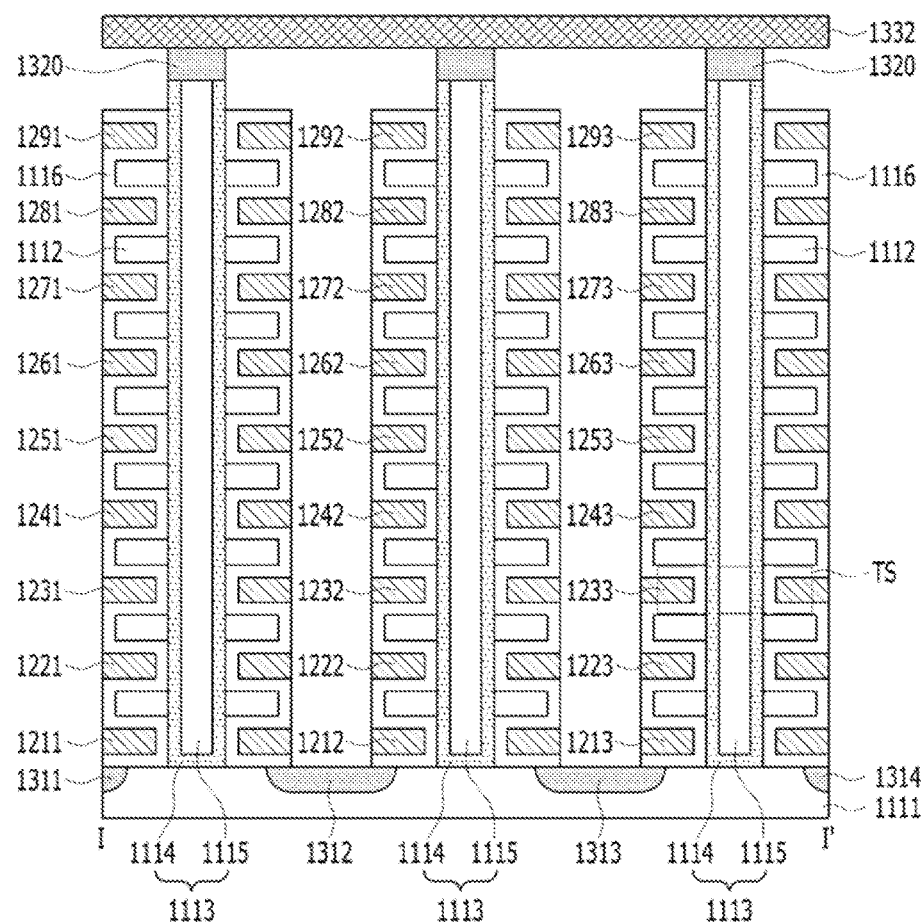

FIG. 8 is a perspective view of one BLKj of the plural memory blocks BLK1 to BLKj shown in FIG. 7, FIG. 9 is a cross-sectional view taken along a line I-I' of the memory block BLKj shown in FIG. 8.

Referring to FIGS. 8 and 9, the memory block BLKj may include structures extending along first to third directions, A substrate 1111 may be provided. For example, the substrate 1111 may include a silicon material doped by first type impurity. For example, the substrate 1111 may include a silicon material doped by p-type impurity or a p-type well for example, a pocket p-well. The substrate 1111 may further include an n-type well surrounding the p-type well. In the description, it is exemplarily assumed that the substrate 1111 is a p-type silicon. However, the substrate 1111 will not be limited to the p-type silicon.

A plurality of doping regions 1311 to 1314 extending along the first direction may be provided on the substrate 1111. For example, the plurality of doping regions 1311 to 1314 may have a second type different from that of the substrate 1111. For example, the plurality of doping regions 1311 to 1314 may be of n-type. In the description, it is exemplarily assumed that the first to fourth doping regions 1311 to 1314 are of n-type. However, the first to fourth doping regions 1311 to 1314 will not be limited to the n-type.

A plurality of insulation materials 1112 extending along the first direction may be sequentially provided along the second direction over the substrate 1111 between the first and second doping regions 1311 and 1312. For example, the plurality of insulation materials 1112 and the substrate 1111 may be provided along the second direction such that they are spaced apart by a predetermined distance. For example, the plurality of insulation materials 1112 may be provided to be spaced apart from each other along the second direction. For example, the insulation materials 1112 may include an insulator such as silicon oxide.

A plurality of pillars 1113 may be sequentially provided along the first direction on a region of the substrate 1111 between the first doping region 1311 and the second doping region 1312, and may be formed to penetrate the insulation materials 1112 along the second direction. For example, each of the plurality of pillars 1113 may penetrate the insulation materials 1112 to contact with the substrate 1111. For example, each of the plural pillars 1113 may be composed of a plurality of materials. For example, a surface layer 1114 of each of the plural pillars 1113 may include a silicon material having a first type. For example, the surface layer 1114 of each of the plural pillars 1113 may include a silicon material doped with the same type as that of the substrate 1111. In the description it is exemplarily assumed that the surface layer 1114 of each of the plural pillar 1113 includes p-type silicon. However, the surface layer 1114 of each of plural pillars 1113 will not be limited to the p-type silicon.

An inner layer 1115 of each of the plural pillars 1113 may be formed of an insulation material. For example, the inner layer 1115 of each of the plural pillars 1113 may be an insulation material such as silicon oxide.

In a region between the first and second doping regions 1311 and 1312, an insulation layer 1116 may be provided along exposed surfaces of the insulation materials 1112, the pillars 1113, and the substrate 1111. For example, the thickness of the insulation material 1116 may be less than a half of the distance between the insulation materials 1112. That is, the insulation layer 1116 may be disposed over a first surface of the insulation materials 1112, More specifically, the insulation layer 1116 is provided between two adjacent insulation materials 1112. For example, the insulation layer 1116 is provided between the first insulation material of the insulation materials 1112 and the second insulation material under the first insulation material.

In the region between the first and second doping regions 1311 and 1312, conductive materials 1211 to 1291 may be provided over a second surface of the insulation layer 1116. The second surface of the insulation layer 1116 is opposite to the first surface of the insulation layer 1116.

The conductive materials 1211-1291, 1212-1292 and 1213-1293 extending along the first direction may be provided between the insulation layers 1116. For example, a plurality of conductive materials 1221 to 1281 extending along the first direction may be provided between the insulation materials 1112. For example, the conductive materials 1211 to 1291 extending along the first direction may be a metallic material. In another embodiment, the conductive materials 1211 to 1291 extending along the first direction may be a conductive material such as polysilicon.

The same structure as disposed between the first and second doping regions 1311 and 1312 may be provided between the second and third doping regions 1312 and 1313. For example, the plurality of insulation materials 1112 extending along the first direction is sequentially arranged in the first direction. The plurality of pillars 1113 penetrates the plurality of insulation materials 1112 along the second direction. The insulation layer 1116 is provided over the plurality of insulation materials 1112 and the plurality of pillars 1113. The plurality of conductive materials 1212 to 1292 extending along the first direction may be provided over the insulation layer 1116.

The same structure as provided between the first and second doping regions 1311 and 1312 may be provided between the third and fourth doping regions 1313 and 1314. For example, the plurality of insulation materials 1112 extending along the first direction is sequentially arranged in the first direction. The plurality of pillars 1113 penetrates the plurality of insulation materials 1112 along the second direction. The insulation layer 1116 is provided over the plurality of insulation materials 1112 and the plurality of pillars 1113. The plurality of conductive materials 1213 to 1293 extending along the first direction may be provided over the insulation layer 1116.

Drains 1320 may be provided on the plurality of pillars 1113 respectively. For example, the drains 1320 may be a silicon material doped with a second type material. For example, the drains 1320 may be a silicon material doped with an n-type material. In an embodiment, it is exemplarily assumed that the drains 320 are a silicon material doped with an n-type silicon material. However, the drains 320 will not be limited to the n-type silicon materials. For example, a width of the drains 1320 may be wider than that of corresponding plural pillars 1113. For example, the drains 1320 may be provided on a top surface of the plural pillars 1113 and are in a pad shape.

Conductive materials 1331 to 1333 extending in the third direction may be provided on the drains 1320. The conductive materials 1331 to 1333 may be sequentially disposed along the first direction. The conductive materials 1331 to 1333 may be respectively coupled to the drains 1320 in the corresponding region. For example, the drains 1320 and the conductive material 1333 extending along the third direction may be coupled to each other through contact plugs, respectively. For example, the conductive materials 1331 to 1333 extending along the third direction may be a metallic material. For example, the conductive materials 1331 to 1333 may be a conductive material such as polysilicon.

Referring to FIGS. 8 and 9, each of the plural pillars 1113 may form a string together with the insulation layer 1116 and the plurality of conductive materials 1211 to 1291, 1212 to 1292, and 1213 to 1293 extending along the first direction. The NAND string NS may include a plurality of transistor structures TS.

Figure 10:
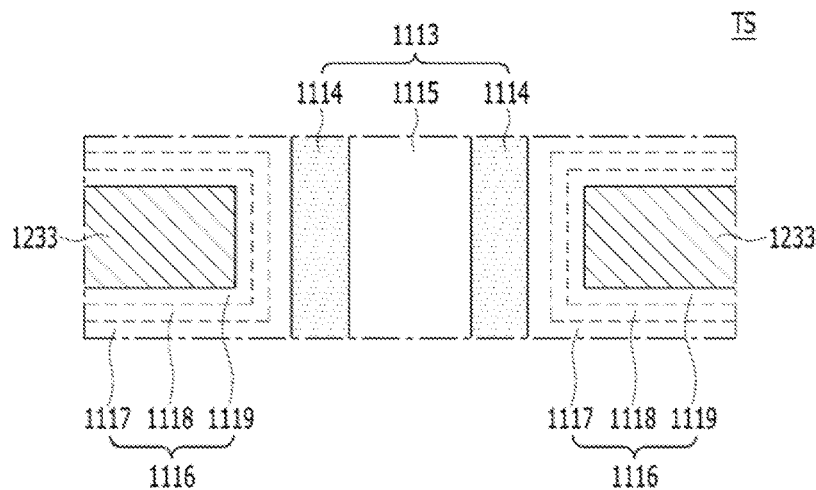

FIG. 10 is a cross-sectional view of a transistor structure TS shown in FIG. 9. Referring to FIGS. 8 to 10, the insulation layer 1116 may include first to third sub insulation layers 1117, 1118 and 1119.

The P-type silicon 1114 of each of the plural pillars 1113 may serve as a body. A first sub insulation layer 1117 formed over the plural pillars 1113 may serve as a tunneling insulation layer. For example, the first sub insulation layer 1117 formed over the each of the plural pillars 1113 may include a thermal oxide layer.

A second sub insulation layer 1118 formed over the first sub insulation layer 1117 may serve as a charge storage layer. For example, the second sub insulation layer 1118 may serve as a charge trap layer. For example, the second sub insulation layer 1118 may include a nitride layer or a metal oxide layer such as, aluminium oxide layer, hafnium oxide layer, etc.

A third sub insulation layer 1119 formed between the second sub insulation layer 1118 and the conductive material 1233 may serve as a blocking insulation layer. For example, the third sub insulation layer 1119 extending along the first direction may have a mono-layered or multi-layered structure. The third sub insulation layer 1119 may be a high dielectric layer such as, aluminium oxide layer, hafnium oxide layer, etc. having a higher dielectric constant than the first and second sub insulation layers 1117 and 1118.

The conductive material 1233 may serve as a gate or a control gate. That is, the gate or the control gate, the blocking insulation layer 1119, the charge trap layer 1118, the tunneling insulation layer 1117, and the body 1114 may form a transistor or a memory cell transistor structure. For example, the first to third sub insulation layers 1117 to 1119 may form an oxide-nitride-oxide (ONO) structure. In an embodiment, the p-type silicon 1114 of each of the plural pillars 1113 extending in the second direction may be referred to as the body.

The memory block BLKj may include the plurality of pillars 1113. That is, the memory block BLKj may include the plurality of NAND strings NS. More specifically, the memory block BLKj may include the plurality of NAND strings NS extending along the second direction or a direction perpendicular to the substrate.

Each of the NAND strings NS may include the plurality of transistor structures TS which are stacked in the second direction. One or more of the plurality of transistor structures TS of each NAND string NS may serve as a string select transistor SST. One or more of the plurality of transistor structures TS of each NAND string may serve as a ground select transistor GST.

The conductive materials 1211 to 1291, 1212 to 1292 and 1213 to 1293 extend along the first direction. Two or more of the conductive materials 1211 to 1291 may serve as select lines such as, one or more string select line SSL and one or more ground select line GSL.

The conductive materials 1331 to 1333 each extending along the third direction may be coupled to one ends of the NAND strings NS. For example, the conductive materials 1331 to 1333 each extending along the third direction may serve as bit lines BL. That is, in one memory block BLKj, a single bit line BL may be coupled to the plurality of NAND strings.

The second type doping regions 1311 to 1314 each extending along the first direction may be provided at the other ends of the NAND strings NS. The second type doping regions 1311 to 1314 each extending along the first direction may serve as common source lines CSL.

In summary, the memory block BLKj may include the plurality of NAND strings NS each extending along a direction (second direction) perpendicular to the substrate 1111. Each of the NAND strings NS may operate as a NAND flash memory block, for example, a charge-trap-type NAND flash memory block.

With reference to FIGS. 8 to 10, the conductive materials 1211 to 1291, 1212 to 1292, and 1213 to 1293, each extending along the first direction, form a 9-layered structure. However, the conductive materials 1211 to 1291, 1212 to 1292, and 1213 to 1293 are not limited to 9 layers. In another embodiment, the conductive materials may include 8, 16 or more layers. That is, a NAND string may include 8, 16 or more transistors.

With reference to FIGS. 8 to 10, 3 NAND strings NS are coupled to a single bit line BL. However, the present invention will not be limited to 3 NAND strings NS coupled to a single bit line BL, For example, in the memory block BLKj, m NAND strings NS where m is an integer may be coupled to a single bit line BL. Here, the number of the conductive materials 1211 to 1291, 1212 to 1292, and 1213 to 1293 each extending along the first direction and the number of common source lines 311 to 314 may also be adjusted so as to correspond to the number of NAND strings NS coupled to a single bit line BL.

With reference to FIGS. 8 to 10, 3 NAND strings NS are coupled to a single conductive material extending along the first direction. However, the present invention will not be limited to the structure where 3 NAND strings NS are coupled to a single conductive material. In another embodiment, n NAND strings NS (n is integer) may be coupled to a single conductive material. Here, the number of the conductive materials 1331 to 1333 each extending along the third direction may also be adjusted to correspond to the number of NAND strings NS coupled to a single conductive material.

Figure 11:
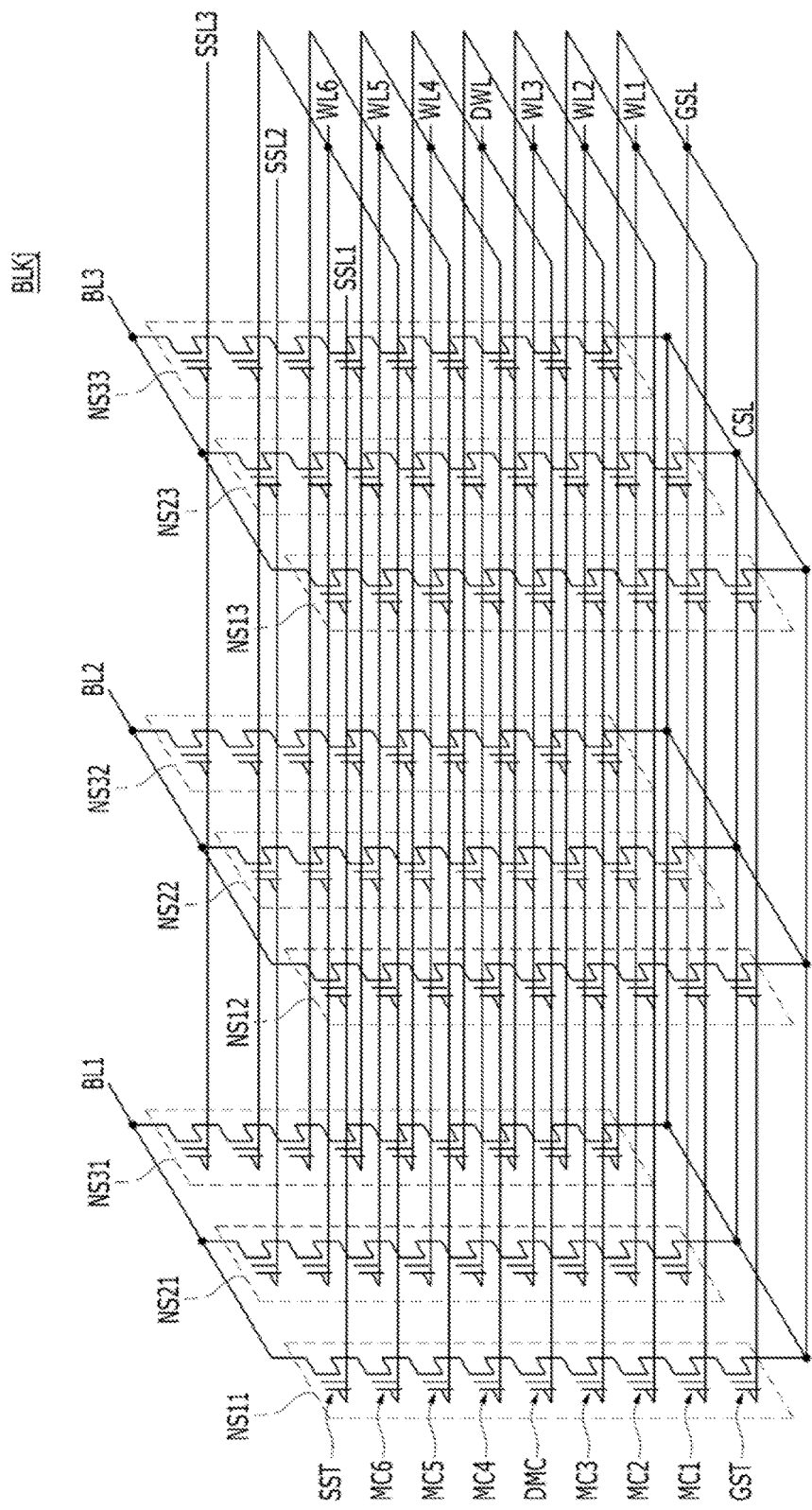

FIG. 11 is an equivalent circuit of the memory block BLKj described with reference to FIGS. 8 to 10. Referring to FIGS. 8 to 11, NAND strings NS11 to NS31 may be provided between a first bit line BL1 and a common source line CSL. The first bit, line BL1 may correspond to the conductive material 1331 extending along the third direction. NAND strings NS12, NS22 and NS32 may be provided between a second bit line BL2 and the common source line CSL. The second bit line BL1 may correspond to the conductive material 1332 extending along the third direction. NAND strings NS13, NS23 and NS33 may be provided between a third bit line BL3 and the common source line CSL. The third bit line BL3 may correspond to a conductive material 1333 extending along the third direction.

A string select transistor SST of each NAND string NS may be coupled to a corresponding bit line BL. A ground select transistor GST of each NAND string NS may be coupled to the common source line CSL. Memory cells MC may be provided between the string select transistor SST and the ground select transistor GST of each NAND string NS.

The NAND strings NS may be defined in units of rows and columns. The NAND strings NS commonly coupled to a single bit line may form a single column. For example, the NAND strings NS11 to NS 31 coupled to the first bit line BL1 may correspond to a first column. The NAND strings NS12 to NS 32 coupled to the second bit line BL2 may correspond to a second column. The NAND strings NS13 to NS 33 coupled to the third bit line BL3 may correspond to a third column. The NAND strings NS coupled to a single string select line SSL may form a single row. For example, the NAND strings NS11 to NS13 coupled to a first string select line SSL1 may form a first row. The NAND strings NS21 to NS23 coupled to a second string select line SSL2 may form a second row. The NAND strings NS31 to NS33 coupled to a third string select line SSL3 may form a third row.

A height may be defined for each NAND string NS. For example, the height of the ground select transistor GST may be defined as 1 in each NAND string NS. In each NAND string N, closer to the string selection transistor SST, the higher the height of the memory cell. In each NAND string NS, the height of the memory cell MC6 adjacent to the string select transistor SST may be defined as 6.

The string select transistors SST of the NAND strings NS of the same row may share the string select line SSL. The string select transistors SST of the NAND strings NS in different rows may be coupled with different string select lines SSL1, SSL2, and SSL3, respectively.

The memory cells MC having the same height in the NAND strings NS of the same row may share the word line WL. At a predetermined height, the word line WL may be shared by the memory cells MC of the NAND strings NS of different rows. At a predetermined height, dummy memory cells DMC of the NAND strings NS of the same row may share a dummy word line DWL. At a predetermined height, the dummy memory cells DMC of the NAND strings NS in different rows may share the dummy word lines DWL.

For example, the word lines WL or the dummy word lines DWL may be commonly coupled to each other at a level where the conductive materials 1211 to 1291, 1212 to 1292, and 1213 to 1293 extending in the first direction are provided. For example, the conductive materials 1211 to 1291, 1212 to 1292, and 1213 to 1293 each extending in the first direction may be coupled to an upper layer (not shown) via a contact. The conductive materials 1211 to 1291, 1212 to 1292, and 1213 to 1293 each extending in the first direction may be coupled to each other at the upper layer % The ground select transistors GST of the NAND strings NS of the same row may share the ground select line GSL. The ground select transistors GST of the NAND strings NS in different rows may share the ground select line GSL. That is, the NAND strings NS11 to NS13, NS21 to NS23, and NS31 to NS33 may be coupled in common to the ground select line GSL.

The common source line CSL may be commonly coupled to the NAND strings NS. For example, the first to fourth doping regions 1311 to 1314 may be coupled at an active region of the substrate 1111. For example, the first to fourth doping regions 1311 to 1314 may be coupled to an upper layer via a contact. The first to fourth doping regions 1311 to 1314 may be coupled in common at the upper layer.

As illustrated in FIG. 11, the word lines WL located at the same level may be commonly coupled to each other. Therefore, when a given word line WL located at a specific level is selected, all of the NAND strings NS coupled to the selected word line WL may be selected. The NAND strings NS of different rows may be coupled to different string select lines SSL. Accordingly, among the NAND strings NS coupled to the selected word line WL, the NAND strings NS further coupled to the unselected row may be electrically isolated from the bit lines BL1 to BL3 through selection of the string selection lines SSL1 to SSL3. That is, a specific row of the NAND strings NS may be selected by selecting the string select lines SSL1 to SSL3. A specific NAND strings NS among the NAND strings NS located at the selected row may be further selected by selection of the bit lines BL1 to BL3.

In each NAND string NS, the dummy memory cell DMC may be provided. For example, as shown in FIG. 11, the first to third memory cells MC1 to MC3 may be provided between the dummy memory cell DMC and the ground select transistor GST.

The fourth to sixth memory cells MC4 to MC6 may be provided between the dummy memory cell DMC and the string select transistor SST. In an embodiment, the memory cells MC in each NAND string NS are divided into memory cell groups by the dummy memory cell DMC. A memory cell group for example, MC1 to MC3, adjacent to the ground select transistor GST among the memory cell groups may be referred to as a lower memory cell group. A memory cell group for example, MC4 to MC6 adjacent to the string select transistor SST among the memory cell groups may be referred to as an upper memory cell group.

An operating method of a semiconductor memory system will be described with reference to FIGS. 7 to 11. The semiconductor memory system may include one or more cell strings. Each cell string is arranged in a direction perpendicular to a substrate and coupled with the memory controller 120. Each cell string includes memory cells, a string select transistor, and a ground select transistor. The semiconductor memory system may be provided with a first read command to perform first and second hard decision read operations using a first hard decision read voltage and a second hard decision read voltage which is different from the first hard decision read voltage. The semiconductor memory system may form hard decision data, may select a particular one of the first and second hard decision voltages based on an error bit state of the hard decision data, may form soft decision data using a soft read voltage which is different from the first and second hard decision read voltages, and provide the soft decision data to a memory controller 120.

Figure 12:
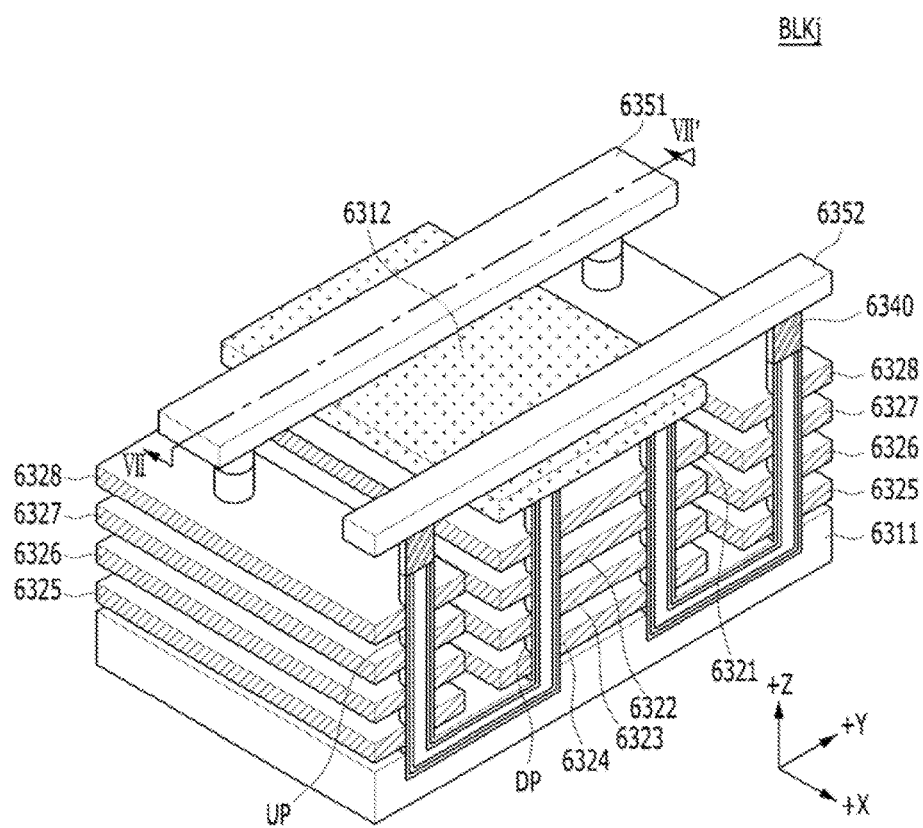
FIGS. 12 to 14 are diagrams schematically illustrating a 3D nonvolatile memory device in accordance with an embodiment of the present invention.
Figure 13:
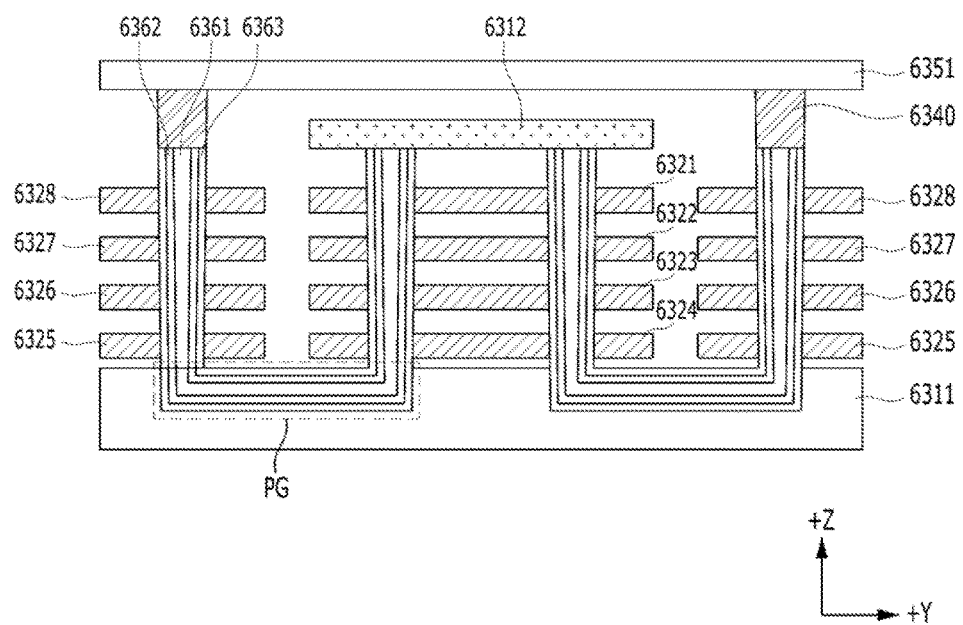
Figure 14:
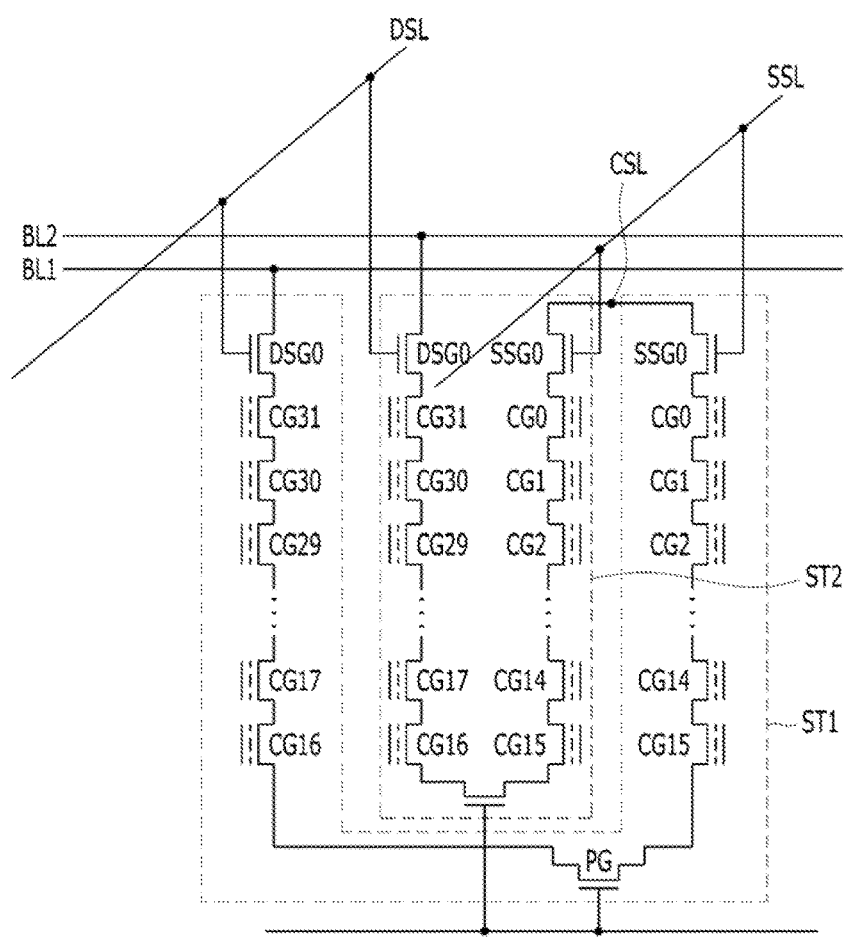

FIGS. 12 to 14 are diagrams schematically illustrating a 3D nonvolatile memory device in accordance with an embodiment of the present invention. FIGS. 12 to 14 illustrate the semiconductor memory system, for example, a three-dimensional flash memory device in accordance with an embodiment of the present invention.

FIG. 12 is a perspective view of the memory block BLKj shown in FIG. 7. FIG. 13 is a sectional view illustrating the memory block BLKj taken along the line VII-VII' shown in FIG. 12. Referring to FIGS. 12 and 13, the memory block BLKj may include structures extending along first to third directions.

A substrate 5311 may be provided. For example, the substrate 6311 may include a silicon material doped by first type impurity. For example, the substrate 6311 may include a silicon material doped by p-type impurity or a p-type well such as, a pocket p-well. The substrate 6311 may further include an n-type well surrounding the p-type well. In an embodiment, the substrate 6311 is a p-type silicon. However, the substrate 6311 is not limited to the p-type silicon.

First to fourth conductive material layers 6321 to 6324 each extending along the X-direction and the Y-direction may be disposed on the substrate 6311. The first to fourth conductive material layers 6321 to 6324 may be spaced from one another in the Z-direction.

Fifth to eighth conductive material layers 6325 to 6328 extending along the X-direction and the Y-direction may be disposed on the substrate 6311. The fifth to eighth conductive material layers 6325 to 6328 may be spaced from one another in the Z-direction. The fifth to eighth conductive material layers 6325 to 6328 may be spaced from the first to fourth conductive material layers 6321 to 6324 in the Y-direction.

A plurality of lower pillars DP may be formed through the first to fourth conductive material layers 6321 to 6324. Each of the plural lower pillars DP may extend in the Z-direction. A plurality of upper pillars UP may be formed through the fifth to eighth conductive material layers 6325 to 6328. Each of the plural upper pillars UP may extend in the Z-direction.

Each of the lower pillars DP and the upper pillars UP may include an internal material layer 6361, a middle layer 6362 and a surface layer 6363, The middle layer 6362 may serve as a channel of the cell transistor. The surface layer 6363 may include a blocking insulating layer, an electric charge storage layer and a tunnel insulating layer.

The plural lower pillars DP and the plural upper pillars UP may be coupled through a pipe gate PG. The pipe gate PG may be formed in the substrate 6311. For example, the pipe gate PG may include substantially the same material as the plural lower pillars DP and the plural upper pillars UP.

A doping material layer 6312 with a second-type impurity may be disposed on the plural lower pillars DP. The doping material layer 6312 may extend in the X-direction and the Y-direction. For example, the doping material layer 6312 with the second type impurity may include n-type silicon material. The doping material layer 6312 with the second type impurity may serve as the common source line CSL.

Drains 6340 may be formed on each of the plural upper pillars UP. For example, the drain 6340 may include n-type silicon material. First and second upper conductive material layers 6351 and 6352 may be formed on the drains 6340. The first and second upper conductive material layers 6351 and 6352 may be extended in the Y-direction.

The first and second upper conductive material layers 6351 and 6352 may be spaced apart from each other in the X-direction. For example, the first and second upper conductive material layers 6351 and 6352 may be made of metal. For example, the first and second upper conductive material layers 6351 and 6352 may be coupled to drains 6340 through contact plugs. The first and second upper conductive material layers 6351 and 6352 may serve as first and second bit lines BL1 and BL2, respectively.

The first conductive material layer 6321 may serve as the source select line SSL, and the second conductive material layer 6322 may serve as the first dummy word line DWL1, and the third and fourth conductive material layers 6323 and 6324 may serve as the first and second main word lines MWL1 and MWL2, respectively. The fifth and sixth conductive material layers 6325 and 6326 may serve respectively as the third and fourth main word lines MWL3 and MWL4, the seventh conductive material layer 6327 may serve as the second dummy word line DWL2, and the eighth conductive material layer 6328 may serve as the drain select line DSL.

Each of the plural lower pillars DP and the first to fourth conductive material layers 6321 to 6324 adjacent to the lower pillar DP may form a lower string. Each of the plural upper pillars UP and the fifth to eighth conductive material layers 6325 to 6328 adjacent to the upper pillar UP may form an upper string. The lower string and the upper string may be coupled to each other through the pipe gate PG. One end of the lower string may be coupled to the second-type doping material layer 6312 serving as the common source line CSL. One end of the upper string may be coupled to a corresponding bit line through the drain 6340. The lower string and the upper string are coupled to each other through the pipe gate PG. A single lower string and a single upper string may form, in combination, a single cell string coupled between the second-type doping material layer 6312 and corresponding bit line.

That is, the lower string may include the source select transistor SST, the first dummy memory cell DMC1, and the first and second main memory cells MMC1 and MMC2. The upper string may include the third and fourth main memory cells MMC3 and MMC4, the second dummy memory cell DMC2 and the drain select transistor DST.

Referring to FIGS. 12 and 13, the upper string and the lower string may form the NAND string NS having a plurality of transistor structures TS. The structure of the transistor TS may be the same as described with reference to FIG. 10.

FIG. 14 is an equivalent circuit of the memory block BLKj described with reference to FIGS. 12 and 13. FIG. 14 illustrates first and second strings among the strings included in the memory block BLKJ according to an embodiment.

Referring to FIG. 14, the memory block BLKJ may include a plurality of cell strings, each of which comprises a single upper string and a single lower string coupled to each other through the pipe gate PG, as described with reference to FIGS. 12 and 13.

In the memory block BLKj, memory cells stacked along a first channel layer CH1, one or more source selection gates, and one or more drain selection gates may form a first string ST1. Memory cells stacked along a second channel layer CH2, one or more source selection gates, and one or more drain selection gates may form a second string ST2.

The first and second strings ST1 and ST2 may be coupled to a single drain selection line DSL and a single source selection line SSL. The first string ST1 may be coupled to a first bit line BL1, and the second string ST2 may be coupled to a second bit line BL2.

FIG. 14 shows the first and second strings ST1 and ST2 coupled to a single drain selection line DSL via the drain selection gate DSG0 and a single source selection line SSL via the source selection gate SSG0. The first and second strings ST1 and ST2 may be coupled to bit lines BL1 and BL2, respectively. In another embodiment, the first string ST1 may be coupled to the first drain selection line DSL1, and the second string ST2 may be coupled to the second drain selection line DSL2. In another embodiment, the first and second strings ST1 and ST2 may be commonly coupled to the same drain selection line DSL and a single bit line BL. In such case, the first string ST1 may be coupled to the first source selection line SSL1, and the second string ST2 may be coupled to the second source selection line SSL2.

Figure 15:
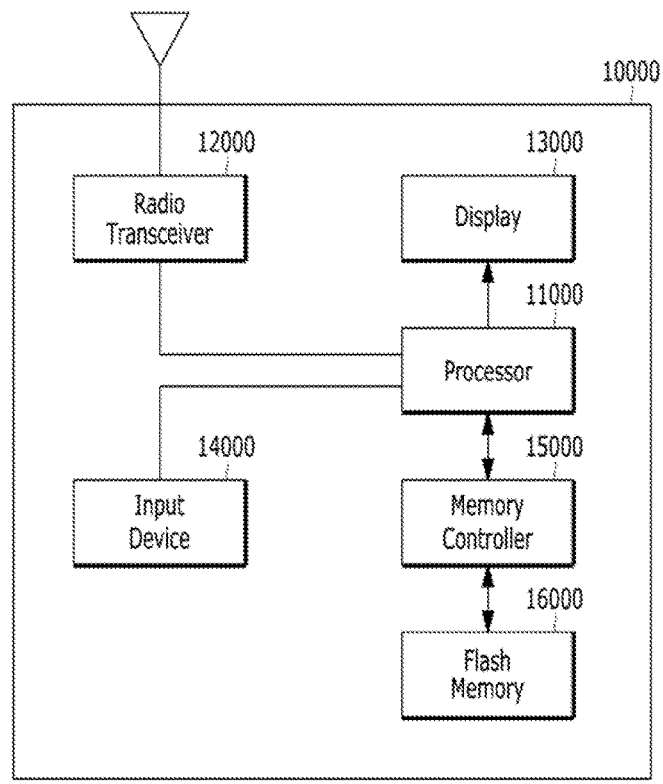
FIG. 15 is a block diagram schematically illustrating an electronic device including a semiconductor memory system in accordance with an embodiment of the present invention.

FIG. 15 is a block diagram schematically illustrating an electronic device 10000 including a memory controller 15000 and a flash memory 16000 in accordance with an embodiment of the present invention.

Referring to FIG. 15, the electronic device 10000 such as a cellular phone, a smart phone, or a tablet PC may include the flash memory 16000 implemented by a flash memory device and the memory controller 15000 to control the flash memory 16000.

The flash memory 16000 may correspond to the semiconductor memory system 110 described above with reference to FIGS. 2 to 14. The flash memory 16000 may store random data. The memory controller 15000 may be controlled by a processor 11000 which controls an overall operation of the electronic device 10000. Data stored at the flash memory 16000 may be displayed through a display 13000 under a control of the memory controller 15000 which operates under a control of the processor 11000.

A radio transceiver 12000 may exchange a radio signal through an antenna ANT. For example, the radio transceiver 12000 may convert a received radio signal from the antenna ANT into a signal to be processed by the processor 11000. Thus, the processor 11000 may process the converted signal from the radio transceiver 12000, and may store the processed signal at the flash memory 16000, Otherwise, the processor 11000 may display the processed signal through the display 13000.

The radio transceiver 12000 may convert a signal' from the processor 11000 into a radio signal, and may output the converted radio signal to an external device through the antenna ANT. An input device 14000 may receive a control signal for controlling an operation of the processor 11000 or data to be processed by the processor 11000 and may be implemented by a pointing device such as a touch pad or a computer mouse, a key pad, or a keyboard.

The processor 11000 may control the display 13000 such that data from the flash memory 16000, a radio signal from the radio transceiver 12000, or data from the input device 14000 is displayed through the display 13000.

Figure 16:
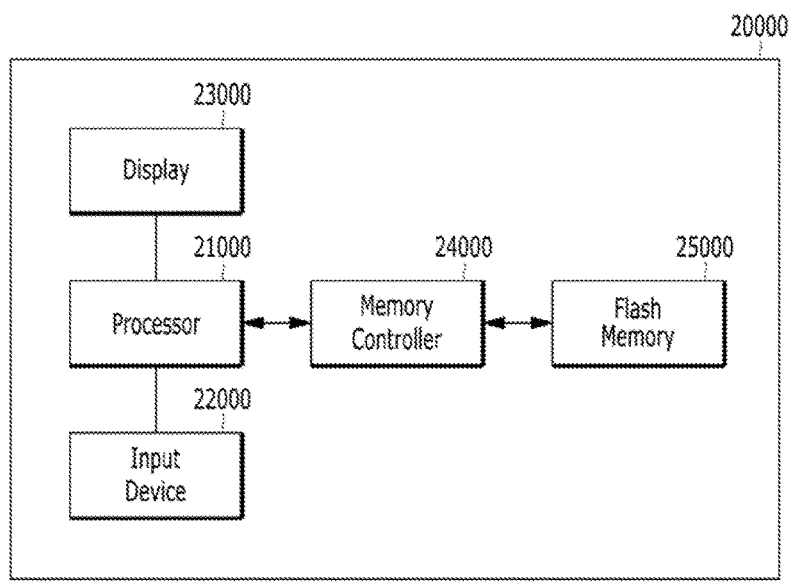
FIG. 16 is a block diagram schematically illustrating an electronic device including a semiconductor memory system in accordance with an embodiment of the present invention.

FIG. 16 is a block diagram schematically illustrating an electronic device 20000 including a memory controller 24000 and a flash memory 25000 in accordance with an embodiment of the present invention. Referring to FIG. 16, the electronic device 20000 may be implemented by a data processing device such as a personal computer (PC), a tablet computer, a net-book, an e-reader, a personal digital assistant (PDA), a portable multimedia player (PMP), an MP3 player, or an MP4 player and may include the flash memory 25000 for example, the flash memory device and the memory controller 24000 to control an operation of the flash memory 25000.

The electronic device 20000 may include a processor 21000 to control an overall operation of the electronic device 20000. The memory controller 24000 may be controlled by the processor 21000.

The processor 21000 may display data stored in the semiconductor memory system through a display 23000 according to an input signal from an input device 22000. For example, the input device 22000 may be implemented by a pointing device such as a touch pad or a computer mouse, a key pad, or a keyboard.

Figure 17:
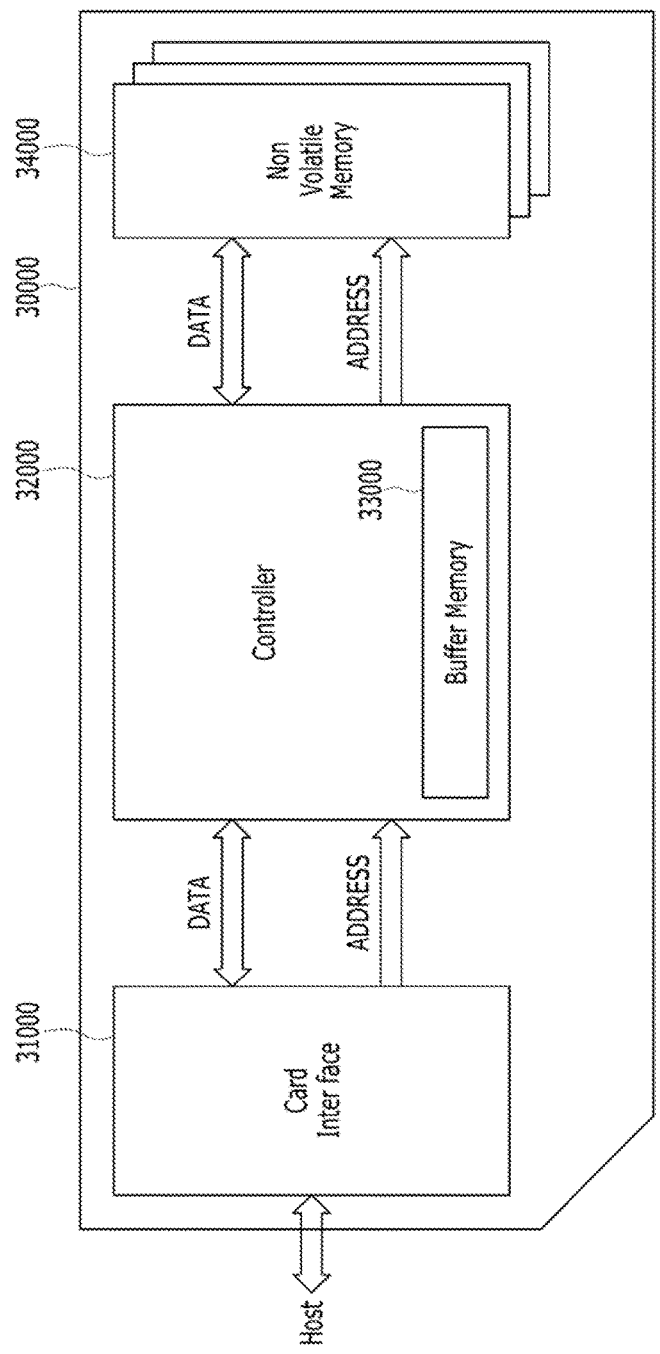
FIG. 17 is a block diagram schematically illustrating an electronic device including a semiconductor memory system in accordance with an embodiment of the present invention.

FIG. 17 is a block diagram schematically illustrating an electronic device 30000 including a semiconductor memory system 34000 in accordance with an embodiment of the present invention. Referring to FIG. 17, the electronic device 30000 may include a card interface 31000, a memory controller 32000, and the semiconductor memory system 34000, for example, the flash memory device.

The electronic device 30000 may exchange data with a host through a card interface 31000. The card interface 31000 may be a secure digital (SD) card interface or a multi-media card (MMC) interface, but not limited thereto. The card interface 31000 may interface a host HOST and the memory controller 32000 according to the communications protocol of the host HOST capable of communicating with the electronic device 30000.

The memory controller 32000 may control an overall operation of the electronic device 30000 and may control data exchange between the card interface 31000 and the semiconductor memory system 34000. A buffer memory 33000 of the memory controller 32000 may buffer data transferred between the card interface 31000 and the semiconductor memory system 34000.

The memory controller 32000 may be coupled with the card interface 31000 and the semiconductor memory system 34000 through a data bus DATA and an address bus ADDRESS. In accordance with an embodiment, the memory controller 32000 may receive an address of data, which is to be read or written, from the card interface 31000 through the address bus ADDRESS and may send it to the semiconductor memory system 34000.

Also, the memory controller 32000 may receive or transfer data through the data bus DATA connected with the card interface 31000 or the semiconductor memory system 34000.

When the electronic device 30000 is connected with the host HOST such as a PC, a tablet PC, a digital camera, a digital audio player, a mobile phone, console video game hardware, or a digital set-top box, the host HOST may exchange data of the semiconductor memory system 34000 through the card interface 31000 and the memory controller 32000.

While the present invention has been described with respect to the specific embodiments, it will be apparent to those skilled in the art that various changes and modifications may be made without departing from the spirit and scope of the invention as defined in the following claims.

What is claimed is:

1. An operation method of a semiconductor memory system, comprising:
    performing a first error correction code (ECC) decoding on a first data stored in the semiconductor memory system, wherein the first data includes user data, an ECC data for the user data and a status data for the user data; and
    performing a second ECC decoding on the user data by changing a read voltage based on the status data of the first data when the first ECC decoding on the user data fails,
    wherein the performing of the second ECC decoding on the user data by changing the read voltage is repeated a predetermined number of times until the second ECC decoding on the user data succeeds,
    wherein the status data includes an index of a program/erase cycle group including an information of a program voltage used when the first data is stored into the semiconductor memory system,
    wherein the program/erase cycle group corresponds to number of program/erase cycles of the semiconductor memory system during a data program operation, and
    wherein the status data represents the program voltage corresponding to a read voltage to be used for reading of the user data programmed.

2. The operation method of claim 1, wherein the information of the program voltage is an index corresponding to one among a plurality of program voltage groups, each of which is a group of program voltages to be used for storing a data into the semiconductor memory system, and each of which is indexed.

3. The operation method of claim 2, wherein the second step performs the second ECC decoding on the user data through a way of read-retry according to one or more read-retry voltages corresponding to the index.

4. The operation method of claim 1,
    wherein the semiconductor memory system is a multi-level cell (MLC) memory system, and
    wherein the status data is an least significant bit (LSB) data.

5. The operation method of claim 4, wherein a most significant bit (MSB) data corresponding to the status data has a value of "FF".

6. The operation method of claim 1, wherein the status data includes a plurality of information of a program voltage used when the first data is stored into the semiconductor memory system.

7. The operation method of claim 1,
    wherein the semiconductor memory system includes a status data storage region, and
    wherein an index of a data unit for a program operation and the status data of the data unit are stored in the status data storage region.

8. A semiconductor memory system, comprising:
    a semiconductor memory device; and
    a controller,
    wherein the controller comprises:
    a first device performing a first ECC decoding on a user data of a first data stored in the semiconductor memory system, wherein the first data includes the user data, an ECC data for the user data, and a status data for the user data; and
    a second device performing a second ECC decoding on the user data by changing a read voltage based on the status data of the first data when the first ECC decoding on the user data fails,
    wherein the performing of the second ECC decoding on the user data by changing the read voltage is repeated a predetermined number of times until the second ECC decoding on the user data succeeds,
    wherein the status data includes an index of a program/erase cycle group including an information of a program voltage used when the first data is stored into the semiconductor memory system,
    wherein the program/erase cycle group corresponds to number of program/erase cycles of the semiconductor memory system during a data program operation, and
    wherein the status data represents the program voltage corresponding to a read voltage to be used for reading of the user data programmed.

9. The semiconductor memory system of claim 8, wherein the information of the program voltage is an index corresponding to one among a plurality of program voltage groups, each of which is a group of program voltages to be used for storing a data into the semiconductor memory system, and each of which is indexed.

10. The semiconductor memory system of claim 9, wherein the second device performs the second ECC decoding on the user data through a way of read-retry according to one or more read-retry voltages corresponding to the index.

11. The semiconductor memory system of claim 8,
    wherein the semiconductor memory system is a multi-level cell (MLC) memory system,
    wherein the status data is an least significant bit (LSB) data, and
    wherein a most significant bit (MSB) data corresponding to the status data has a value of "FF".

12. The semiconductor memory system of claim 8, wherein the status data includes a plurality of information of a program voltage used when the first data is stored into the semiconductor memory system.

13. The semiconductor memory system of claim 8,
    wherein the semiconductor memory system includes a status data storage region, and
    wherein an index of a data unit for a program operation and the status data of the data unit are stored in the status data storage region.

14. A controller, comprising:
- a first device performing a first ECC decoding with a first read voltage on a user data of a first data stored in a semiconductor memory system, and for determining whether or not the first decoding on the user data succeeds, wherein the first data includes the user data, an ECC data for the user data, and a status data for the user data;
- a second device changing the first read voltage to a second read voltage based on the status data of the first data when the first ECC decoding on the user data fails; and
- a third device performing a second ECC decoding with the second read voltage on the user data, and for determining whether or not the second decoding on the user data succeeds,
- wherein the third device repeats the performing of the second ECC decoding on the user data by changing the second read voltage a predetermined number of times until the second ECC decoding on the user data succeeds,
- wherein the status data includes an index of a program/erase cycle group including an information of a program voltage used when the first data is stored into the semiconductor memory system,
- wherein the program/erase cycle group corresponds to number of program/erase cycles of the semiconductor memory system during a data program operation, and
- wherein the status data represents the program voltage corresponding to a read voltage to be used for reading of the user data programmed.

15. The controller of claim 14, wherein the information of the program voltage is an index corresponding to one among a plurality of program voltage groups, each of which is a group of program voltages to be used for storing a data into the semiconductor memory system, and each of which is indexed.

16. The controller of claim 15, wherein the third device performs the second ECC decoding on the user data through a way of read-retry according to one or more read-retry voltages corresponding to the index.

17. The controller of claim 14, wherein the status data includes a plurality of repeated information of a program voltage used when the first data is stored into the semiconductor memory system.

* * * * *